(12) United States Patent
Kanda et al.

(10) Patent No.: US 12,477,771 B2
(45) Date of Patent: Nov. 18, 2025

(54) SEMICONDUCTOR DEVICE

(71) Applicant: Nuvoton Technology Corporation Japan, Kyoto (JP)

(72) Inventors: Yusuke Kanda, Toyama (JP); Jun Shimizu, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/848,769

(22) PCT Filed: Feb. 20, 2023

(86) PCT No.: PCT/JP2023/006048
§ 371 (c)(1),
(2) Date: Sep. 19, 2024

(87) PCT Pub. No.: WO2023/181749
PCT Pub. Date: Sep. 28, 2023

(65) Prior Publication Data
US 2025/0113526 A1   Apr. 3, 2025

Related U.S. Application Data

(60) Provisional application No. 63/323,736, filed on Mar. 25, 2022.

(51) Int. Cl.
*H10D 30/47* (2025.01)
*H10D 62/85* (2025.01)
(Continued)

(52) U.S. Cl.
CPC ....... *H10D 30/475* (2025.01); *H10D 62/8503* (2025.01); *H10D 64/251* (2025.01); *H10D 64/602* (2025.01)

(58) Field of Classification Search
CPC ............ H10D 30/475; H10D 62/8503; H10D 64/251; H10D 64/602; H10D 62/343;
(Continued)

(56) References Cited

U.S. PATENT DOCUMENTS

| 7,985,986 B2 * | 7/2011 | Heikman | H10D 30/015 |
| | | | 257/E29.246 |
| 8,309,987 B2 * | 11/2012 | Derluyn | H10D 30/47 |
| | | | 257/192 |

(Continued)

FOREIGN PATENT DOCUMENTS

| JP | 2009-076845 A | 4/2009 |
| JP | 2012-510172 A | 4/2012 |

(Continued)

OTHER PUBLICATIONS

International Search Report dated May 9, 2023 issued in International Patent Application No. PCT/JP2023/006048, with English translation.

(Continued)

*Primary Examiner* — Jay C Kim
(74) *Attorney, Agent, or Firm* — Rimon P.C.

(57) ABSTRACT

A semiconductor device includes a substrate, a back-barrier layer, a channel layer that has a band gap smaller than a band gap of the back-barrier layer, a first barrier layer that has a band gap larger than the band gap of the channel layer, a second barrier layer that is provided to fill a first recessed portion and has a band gap larger than the band gap of the channel layer, a source electrode, a drain electrode, and a gate electrode. An In composition ratio of the first barrier layer is greater than or equal to 0 and less than an In composition ratio of the second barrier layer. An Al composition ratio of the first barrier layer is greater than or equal to an Al composition ratio of the second barrier layer.

11 Claims, 9 Drawing Sheets

(51) Int. Cl.
*H10D 64/23* (2025.01)
*H10D 64/60* (2025.01)

(58) Field of Classification Search
CPC .... H10D 30/015; H10D 30/061; H10D 30/47; H10D 30/87; H10D 62/117; H10D 62/83; H10D 64/256; H10D 64/513
See application file for complete search history.

(56) References Cited

U.S. PATENT DOCUMENTS

| | | | | |
|---|---|---|---|---|
| 8,624,260 | B2 * | 1/2014 | Ramdani | H01L 21/0254 |
| | | | | 257/E21.403 |
| 8,698,162 | B2 * | 4/2014 | Lee | H10D 30/475 |
| | | | | 257/192 |
| 8,853,709 | B2 * | 10/2014 | Chu | H10D 30/021 |
| | | | | 257/77 |
| 8,860,089 | B2 * | 10/2014 | Park | H10D 30/47 |
| | | | | 257/194 |
| 8,928,038 | B2 * | 1/2015 | Okamoto | H10D 62/824 |
| | | | | 257/192 |
| 8,941,118 | B1 * | 1/2015 | Chu | H10D 30/4755 |
| | | | | 257/E21.441 |
| 8,957,425 | B2 * | 2/2015 | Yamada | H01L 21/28264 |
| | | | | 257/E21.409 |
| 9,590,071 | B2 * | 3/2017 | Masumoto | H01L 21/28264 |
| 9,812,532 | B1 * | 11/2017 | Chu | H10D 62/151 |
| 9,984,884 | B2 * | 5/2018 | Inoue | H10D 30/015 |
| 10,692,984 | B2 * | 6/2020 | Chu | H10D 62/8503 |
| 11,342,428 | B2 * | 5/2022 | Shih | H10D 30/475 |
| 11,894,441 | B2 * | 2/2024 | Chang | H10D 30/015 |
| 11,973,134 | B2 * | 4/2024 | Teo | H10D 62/824 |
| 12,002,879 | B2 * | 6/2024 | Hwang | H10D 62/117 |
| 12,230,702 | B2 * | 2/2025 | Denninghoff | H10D 62/151 |
| 2004/0155260 | A1 * | 8/2004 | Kuzmik | H10D 30/475 |
| | | | | 257/E29.252 |
| 2009/0057720 | A1 | 3/2009 | Kaneko | |
| 2010/0148153 | A1 | 6/2010 | Hudait et al. | |
| 2013/0248873 | A1 | 9/2013 | Kuraguchi et al. | |
| 2014/0091364 | A1 | 4/2014 | Imanishi et al. | |
| 2014/0097468 | A1 | 4/2014 | Okita et al. | |
| 2016/0064539 | A1 | 3/2016 | Lu et al. | |
| 2016/0300835 | A1 | 10/2016 | Xia et al. | |
| 2021/0005739 | A1 | 1/2021 | Sun et al. | |
| 2021/0126118 | A1 * | 4/2021 | Baines | H01L 21/02579 |

FOREIGN PATENT DOCUMENTS

| | | |
|---|---|---|
| JP | 2013-201370 A | 10/2013 |
| JP | 2014-072397 A | 4/2014 |
| JP | 2015-536570 A | 12/2015 |
| JP | 2021-510461 A | 4/2021 |
| WO | 2010/074906 A1 | 7/2010 |
| WO | 2013/008422 A1 | 1/2013 |
| WO | 2014/078699 A1 | 5/2014 |

OTHER PUBLICATIONS

Written Opinion of the International Searching Authority dated May 9, 2023 issued in International Patent Application No. PCT/JP2023/006048, with English translation.

* cited by examiner

SEMICONDUCTOR DEVICE

CROSS-REFERENCE TO RELATED APPLICATIONS

This application is the U.S. National Phase under 35 U.S.C. § 371 of International Patent Application No. PCT/JP2023/006048, filed on Feb. 20, 2023, which in turn claims the benefit of U.S. Provisional Patent Application No. 63/323,736, filed on Mar. 25, 2022, the entire disclosures of which Applications are incorporated by reference herein.

TECHNICAL FIELD

The present disclosure relates to a semiconductor device, particularly a group-III nitride semiconductor device in which a group-III nitride semiconductor is used.

BACKGROUND ART

A group-III nitride semiconductor device in which a group-III nitride semiconductor, particularly, gallium nitride (GaN) or aluminum gallium nitride (AlGaN) is used has a high breakdown voltage due to a wide band gap of a material. Moreover, in the group-III nitride semiconductor device, a heterostructure of AlGaN/GaN or the like can be easily formed.

In the heterostructure of AlGaN/GaN, a channel is formed by high density electrons (hereinafter, referred to as two-dimensional electron gas (2DEG)) on a GaN layer side of an AlGaN/GaN interface due to spontaneous polarization of AlGaN and GaN and piezoelectric polarization caused by a lattice constant difference between materials. The group-III nitride semiconductor device in which the channel of the two-dimensional electron gas is used is applied to a high frequency power device since the group-III nitride semiconductor has relatively high electron saturation velocity, relatively high insulation resistance, and relatively high thermal conductivity.

In order to enhance these characteristics in the group-III nitride semiconductor device, miniaturization of gate size (hereinafter, represented by Lg) is effective. However, generally speaking, when Lg<0.25 μm is satisfied by miniaturization, a depletion layer becomes unlikely to spread. Accordingly, there is a problem that a phenomenon called a short-channel effect in which leakage current in a gate-off state (off-state leakage current between a source and a drain) flows occurs. Therefore, the short-channel effect should be suppressed as much as possible.

Patent Literature (PTL) 1 discloses a nitride semiconductor device in which a recess is provided in a channel layer. The nitride semiconductor device includes a first carrier supply layer provided in an area other than the recess, a second carrier supply layer stacked to cover the recess and the first carrier supply layer, and a gate electrode provided above the recess. Moreover, the second carrier supply layer has a band gap smaller than that of the first carrier supply layer.

CITATION LIST

Patent Literature

[PTL 1] WO2013/008422

SUMMARY OF INVENTION

Technical Problem

According to the nitride semiconductor device described in PTL 1, the electron density of 2DEG in an area below the gate electrode and the electron density of 2DEG in an area other than the area below the gate electrode change at the same time. In other words, the electron density of 2DEG in the area below the gate electrode cannot be independently controlled. Therefore, there is a problem that constriction of a channel becomes insufficient and the short-channel effect cannot be suppressed.

The present disclosure has been conceived in view of the above problem and has an object to provide a semiconductor device that can suppress the short-channel effect.

Solution to Problem

In order to achieve the above object, an aspect of a semiconductor device according to the present disclosure includes: a substrate; a back-barrier layer that is provided above the substrate and includes a group-III nitride semiconductor; a channel layer that is provided above the back-barrier layer, includes a gallium nitride semiconductor, and has a band gap smaller than a band gap of the back-barrier layer; a first barrier layer that is provided above the channel layer, includes a group-III nitride semiconductor containing Al, and has a band gap larger than the band gap of the channel layer; a second barrier layer that is provided to fill a first recessed portion provided in an upper face of the channel layer, includes a group-III nitride semiconductor containing Al, and has a band gap larger than the band gap of the channel layer; a two-dimensional electron gas that is generated on a channel layer side of an interface between the channel layer and the first barrier layer or the second barrier layer; a source electrode and a drain electrode that are provided above the first barrier layer, spaced apart from each other, and each electrically connected to the two-dimensional electron gas; and a gate electrode that is provided above the second barrier layer and spaced apart from the source electrode and the drain electrode. An In composition ratio of the first barrier layer is greater than or equal to 0 and less than an In composition ratio of the second barrier layer, and an Al composition ratio of the first barrier layer is greater than or equal to an Al composition ratio of the second barrier layer.

Advantageous Effects of Invention

According to a semiconductor device according to the present disclosure, a short-channel effect can be suppressed.

DESCRIPTION OF EMBODIMENTS

Figure 1:
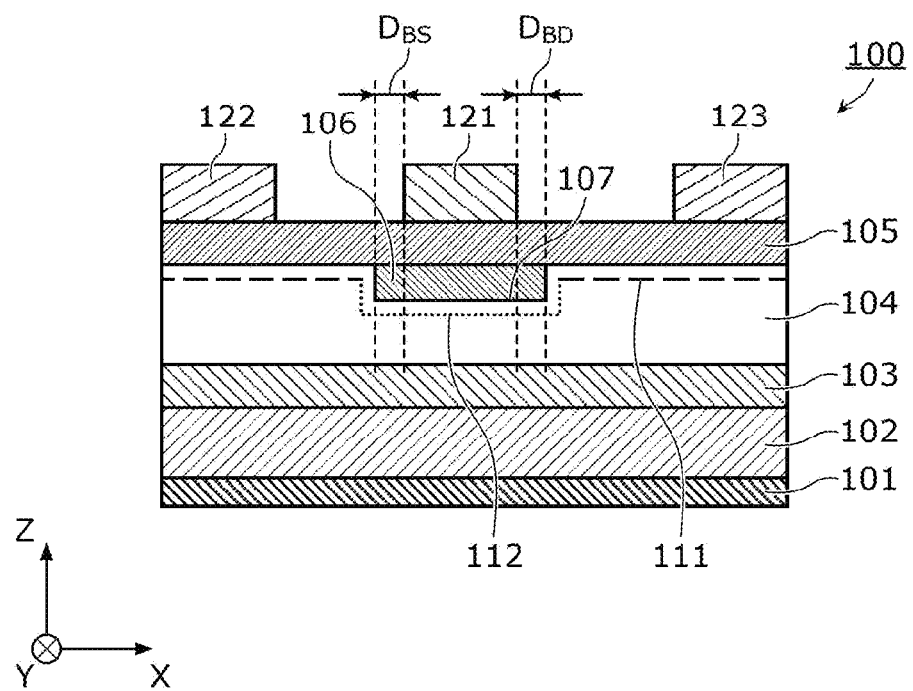
FIG. 1 is a cross-sectional view illustrating a configuration of a semiconductor device according to Embodiment 1.

Hereinafter, specific embodiments of a semiconductor device or the like according to an aspect of the present disclosure are described with reference to the Drawings.

It should be noted that each of the embodiments described below shows a specific example of the present disclosure. Accordingly, the numerical values, shapes, materials, constituent elements, the arrangement and connection of the constituent elements, steps (processes), the order of the steps, etc. shown in the following embodiments are mere examples, and therefore do not limit the scope of the present disclosure. Moreover, among the constituent elements in the following embodiments, constituent elements not recited in the independent claim are described as arbitrary constituent elements.

Furthermore, the respective figures are schematic diagrams and are not necessarily precise illustrations. In the respective figures, elements that are essentially the same share like reference signs, and overlapping descriptions thereof are omitted or simplified.

Moreover, in the present Description, a term indicating a relationship between elements, such as parallel or vertical, a term indicating the shape of an element, such as rectangle, and a numerical range are not limited to the strict meaning thereof and include a substantially same range or a margin of error of a few percent, for example.

Furthermore, in the present Description, terms "above" and "below" in a configuration of a semiconductor device do not indicate an upward (vertically upward) direction and a downward (vertically downward) direction in terms of absolute spatial recognition, and are used as terms defined by a relative positional relationship based on the stacking order of a stacked structure. Furthermore, the terms "above" and "below" are applied not only when two constituent elements are arranged with a gap therebetween and another constituent element is interposed between the two constituent elements, but also when two constituent elements are arranged close to each other and the two constituent elements are in contact with each other.

Furthermore, in the present Description and the Drawings, the X, Y, and Z axes represent the three axes in a three-dimensional orthogonal coordinate system. In each embodiment, two axes parallel to a main face (upper face) of a substrate included in a semiconductor device are referred to as the X and Y axes, and a direction orthogonal to the main face is referred to as the Z-axis direction. Specifically, a direction in which a source electrode, a gate electrode, and a drain electrode are arranged in the stated order, that is, so-called a gate length direction is referred to as the X-axis direction. In the embodiments described below, the positive Z-axis direction may be referred to as "above" and the negative Z-axis direction may be referred to as "below". Moreover, in the present Description, "plan view" is a view in which the main face (upper face) of the substrate included in the semiconductor device is seen from the positive Z-axis direction, unless otherwise specified.

Furthermore, in the present Description, ordinal numbers, such as "first" and "second", do not mean the number or order of constituent elements unless otherwise specified, and are used for the purpose of avoiding confusion of constituent elements of the same type and differentiating them.

Furthermore, in the present Description, a group-III nitride semiconductor is a semiconductor including one or more types of group-III elements and nitrogen. The group-III elements are, for example, aluminum (Al), gallium (Ga), indium (In), and the like. Examples of the group-III nitride semiconductor include GaN, AlN, InN, AlGaN, InGaN, AlInGaN, and the like. The group-III nitride semiconductor may include one or more types of elements other than the group-III elements, such as silicon (Si), phosphorus (P), and the like. It should be noted that in the following description, when the group-III nitride semiconductor is described as AlInGaN, it means that the group-III nitride semiconductor includes Al, In, Ga, and N, unless otherwise specified. The same applies to other description such as AlGaN, GaN, and the like.

Moreover, a layer consisting of a group-III nitride semiconductor or a layer composed of a group-III nitride semiconductor means that the layer substantially includes only the group-III nitride semiconductor. However, for example, the layer may include, as an impurity, another element such as an element that is inevitably mixed into the layer during manufacturing of the layer, in a ratio of 1 at % or less.

Moreover, in the present Description, a group-III element composition ratio of a nitride semiconductor (layer) represents a ratio of the number of atoms of the group III element to the rest of a plurality of group-III elements included in the nitride semiconductor. For example, when a nitride semiconductor layer consists of $Al_aIn_bGa_cN$ (where, $a+b+c=1$, $a≥0$, $b≥0$, and $c≥0$ are satisfied), the Al composition ratio of the nitride semiconductor layer can be represented by $a/(a+b+c)$. Similarly, the In composition ratio and the Ga composition ratio can be represented by $b/(a+b+c)$ and $c/(a+b+c)$, respectively.

Embodiment 1

First, a semiconductor device according to Embodiment 1 is described with reference to FIG. 1. FIG. 1 is a cross-sectional view illustrating a configuration of semiconductor device 100 according to Embodiment 1.

Semiconductor device 100 is a nitride semiconductor device formed using a group-III nitride semiconductor. In the present embodiment, a case in which semiconductor device 100 is a high electron mobility transistor (HEMT) is described.

As illustrated in FIG. 1, semiconductor device 100 includes substrate 101, buffer layer 102, back-barrier layer 103, channel layer 104, first barrier layer 105, second barrier layer 106, gate electrode 121, source electrode 122, drain electrode 123, first 2DEG 111, and second 2DEG 112.

In semiconductor device 100 according to Embodiment 1, a threshold voltage of a gate is, for example, −3 V. As an example, semiconductor device 100 is operated by applying a potential of 0 V to source electrode 122, a potential of +30 V to drain electrode 123, and a potential of between approximately −3 V and +1 V to gate electrode 121. It should be noted that a potential applied to drain electrode 123 may be a potential within a range of at least 20 V and not greater than 50 V. Moreover, the value and range of a potential applied to each electrode may be adjusted according to a threshold voltage of a gate, a forward voltage, and an operation method.

Substrate 101 is, for example, a substrate that consists of Si and has a (111) plane as its main face. Substrate 101 is not limited to a substrate consisting of Si, and may be a substrate consisting of Sapphire, SiC, GaN, AlN, or the like.

Buffer layer 102 is provided above substrate 101. For example, buffer layer 102 is provided on an upper face of substrate 101. Buffer layer 102 consists of, for example, a group-III nitride semiconductor. As an example, buffer layer 102 consists of a stacked structure of AlN and AlGaN having a thickness of 2 μm. For example, buffer layer 102 is composed of a group-III nitride semiconductor layer including an area where the carbon concentration is 1E-19 atoms·cm$^{-3}$ or more. Alternatively, buffer layer 102 may include a structure in which a plurality of $Al_{1-\alpha}G_{\alpha}N$ (where, $0≤\alpha<0.8$ is satisfied) layers are stacked. It should be noted that the thickness and carbon concentration of buffer layer 102 is not limited to the above examples.

Moreover, buffer layer 102 may include a superlattice structure. Specifically, buffer layer 102 may be composed by stacking at least 20 pairs and not more than 100 pairs of layers, where each pair consists of AlN and AlGaN. Moreover, buffer layer 102 may be composed of a single layer or a plurality of layers of a group-III nitride semiconductor such as GaN, AlGaN, AlN, InGaN, or AlInGaN. It should be noted that buffer layer 102 is not necessarily provided.

Back-barrier layer 103 is a layer that is provided above substrate 101 and consists of a group-III nitride semiconductor. Back-barrier layer 103 has a band gap larger than that of channel layer 104 and is provided on an upper face of buffer layer 102. Back-barrier layer 103 is, for example, composed of $Al_{0.05}Ga_{0.95}N$ having a thickness of at least 1000 nm and not more than 1395 nm and an Al composition ratio of 5%. It should be noted that back-barrier layer 103 is not limited to $Al_{0.05}Ga_{0.95}N$. The Al composition ratio of back-barrier layer 103 may be at least 1% and not more than 10%. Moreover, back-barrier layer 103 may include In. It should be noted that back-barrier layer 103 may be doped with Fe, Mg, or C to increase a potential of back-barrier layer 103.

Channel layer 104 is provided above back-barrier layer 103. For example, channel layer 104 is provided on an upper face of back-barrier layer 103. Channel layer 104 consists of a gallium nitride semiconductor (GaN). Channel layer 104 has a band gap smaller than that of back-barrier layer 103. Channel layer 104 is, for example, composed of GaN having a thickness of 100 nm. It should be noted that the layer thickness of channel layer 104 may be at least 20 nm and not more than 150 nm. Moreover, channel layer 104 may partially include an n-type impurity.

First barrier layer 105 has a band gap larger than that of channel layer 104 and is provided above channel layer 104. For example, first barrier layer 105 is provided on each of an upper face of channel layer 104 and an upper face of second barrier layer 106. First barrier layer 105 consists of a group-III nitride semiconductor including Al. It should be noted that first barrier layer 105 is not limited to AlGaN, and may be composed of a group-III nitride semiconductor such as AlInGaN. Moreover, first barrier layer 105 may include an n-type impurity.

It should be noted that, for example, a layer that consists of GaN and has a thickness of at least approximately 1 nm and not more than approximately 2 nm may be provided as a capping layer above first barrier layer 105.

Second barrier layer 106 is provided so as to fill first recessed portion 107. In other words, specifically, second barrier layer 106 is provided between first barrier layer 105 and channel layer 104 in a directly downward direction of gate electrode 121 so that second barrier layer 106 is embedded on a channel layer 104 side. It should be noted that "directly downward direction" means a position where things are overlapped in the plan view.

In the present embodiment, second barrier layer 106 is provided so as to completely fill first recessed portion 107. Therefore, the upper face of second barrier layer 106 and the upper face of channel layer 104 (a portion that is outside of first recessed portion 107) are flush with each other. Moreover, in the XZ cross section, a cross-sectional shape of second barrier layer 106 and a cross-sectional shape of first recessed portion 107 are substantially the same.

It should be noted that first recessed portion 107 is provided in the upper face of channel layer 104. First recessed portion 107 is a recessed portion that is recessed from the upper face of channel layer 104 (here, an interface between channel layer 104 and first barrier layer 105) toward substrate 101. In the plan view, first recessed portion 107 is provided at a position overlapping gate electrode 121. In other words, first recessed portion 107 is located in the directly downward direction of gate electrode 121.

In the present embodiment, the cross-sectional shape (XZ cross section) of first recessed portion 107 is rectangular as illustrated in FIG. 1. Namely, a bottom face of first recessed portion 107 is parallel to the main face of substrate 101. Moreover, a lateral face of first recessed portion 107 is perpendicular to the main face of substrate 101. It should be noted that the shape of first recessed portion 107 is not limited to a rectangle. For example, a lateral face of first recessed portion 107 may be sloped with respect to the main face of substrate 101.

Second barrier layer 106 consists of a group-III nitride semiconductor including Al. Specifically, second barrier layer 106 consists of a group-III nitride semiconductor including Al and In. Second barrier layer 106 has a band gap larger than that of channel layer 104. Second barrier layer 106 may include an n-type impurity.

It should be noted that although not illustrated in FIG. 1, a field plate electrode may be provided between gate electrode 121 and drain electrode 123 in the plan view. When the field plate electrode is provided, second barrier layer 106 may be provided in the directly downward direction of the field plate electrode.

Gate electrode 121 is provided between source electrode 122 and drain electrode 123 and spaced apart from source electrode 122 and drain electrode 123. In the present embodiment, gate electrode 121 is provided above first barrier layer 105. Specifically, gate electrode 121 is provided on an upper face of first barrier layer 105.

Gate electrode 121 is formed using a conductive material. For example, gate electrode 121 is a multi-layer electrode film consisting of a stacked structure in which TiN and Al are sequentially stacked. It should be noted that gate electrode 121 is not limited to TiN and Al, and may be a conductive metal nitride film of TiN, WN, TaN, HfN, or the like, a conductive metal carbide film of TiC, WC, HfC, or the like, or a metal of Ti, Ta, W, Ni, Pd, Pt, Hf, Ru, Au, Cu, or the like or an alloy thereof. Alternatively, gate electrode 121 may be a compound including the above-described elements, or a multi-layer electrode film consisting of a plurality of stacked structures.

Moreover, a gate length Lg of gate electrode 121 is 0.10 μm. It should be noted that the gate length Lg of gate electrode 121 is not limited to 0.15 μm, and may be at least 0.01 μm and not more than 0.25 μm.

Moreover, gate electrode 121 is in contact with first barrier layer 105 to form a Schottky barrier junction. It should be noted that, an insulating film or a p-type nitride semiconductor layer may be provided between first barrier layer 105 and gate electrode 121.

Source electrode 122 and drain electrode 123 are provided above first barrier layer 105 and spaced apart from each other. Specifically, source electrode 122 and drain electrode 123 are provided so as to oppose each other with gate electrode 121 interposed therebetween.

Each of source electrode 122 and drain electrode 123 is formed using a conductive material. For example, each of source electrode 122 and drain electrode 123 is a multi-layer electrode film consisting of a stacked structure in which Ti and Al are sequentially stacked. It should be noted that each of source electrode 122 and drain electrode 123 is not limited to the stacked structure of Ti and Al, and may be a metal of Ti, Ta, Hf, Ru, Al, W, or the like or an alloy thereof, or a conductive metal nitride film of TiN, WN, TaN, or the like.

It should be noted that a recessed portion may be formed by removing a portion of first barrier layer 105 and/or channel layer 104, and a contact layer including an n-type impurity including a donor such as Si may be provided in the recessed portion formed. Moreover, the contact layer including the n-type impurity may be formed by plasma treatment, ion injection, regrowth, or the like.

Furthermore, source electrode 122 and drain electrode 123 are electrically connected to 2DEG generated on a channel layer 104 side of an interface between channel layer 104 and first barrier layer 105 and second barrier layer 106. Specifically, source electrode 122 and drain electrode 123 are in electrical ohmic contact with first 2DEG 111.

In the present embodiment, 2DEG is generated on the channel layer 104 side of the interface between channel layer 104 and each of first barrier layer 105 and second barrier layer 106, due to the influence of piezoelectric polarization and spontaneous polarization. Specifically, first 2DEG 111 is generated at the interface between channel layer 104 and first barrier layer 105. Second 2DEG 112 is generated at the interface between channel layer 104 and second barrier layer 106.

Here, the In composition ratio of first barrier layer 105 is greater than or equal to 0 and less than the In composition ratio of second barrier layer 106. In other words, the following relationship is satisfied: 0≤In composition ratio of first barrier layer 105<In composition ratio of second barrier layer 106.

Moreover, the Al composition ratio of first barrier layer 105 is greater than or equal to the Al composition ratio of second barrier layer 106. In other words, the following relationship is satisfied: Al composition ratio of first barrier layer 105≥Al composition ratio of second barrier layer 106.

By satisfying the above-described relationships related to In composition ratio and Al composition ratio, the electron density of second 2DEG 112 (also referred to as concentration of 2DEG) generated in the directly downward direction of gate electrode 121 can be lower than the electron density of first 2DEG 111 generated in a direction other than the directly downward direction of gate electrode 121. Therefore, since a depletion layer generated in the directly downward direction of gate electrode 121 becomes likely to spread when semiconductor device 100 is OFF, the short-channel effect can be suppressed.

Next, two specific examples of semiconductor device 100 with the above-described configuration, that is, Examples 1 and 2 are described. Examples 1 and 2 have the same configuration except for the configuration of first barrier layer 105 and second barrier layer 106. Specifically, the relationship of average lattice constant between channel layer 104, first barrier layer 105, and second barrier layer 106 is different between Example 1 and Example 2. It should be noted that an average lattice constant can be calculated based on an average value of the element composition ratio of a group-III nitride semiconductor, for example.

Example 1

In Example 1, the average lattice constant of second barrier layer 106 is less than the average lattice constant of channel layer 104 and greater than the average lattice constant of first barrier layer 105. In other words, regarding the average lattice constants, relational expression (1) below is satisfied.
(1) Channel Layer 104>Second Barrier Layer 106>First Barrier Layer 105

In a group-III nitride semiconductor, the average lattice constant increases as the In composition ratio increases. In contrast, the average lattice constant decreases as the Al composition ratio or the Ga composition ratio increases. In comparison of Al with Ga, the average lattice constant increases as the Ga composition ratio increases. The average lattice constant decreases as the Al composition ratio increases. For example, the average lattice constants of AlN, GaN, and InN satisfy the following relationship: AlN<GaN<InN. It should be noted that the relationship regarding band gap is opposite to the relationship regarding average lattice constant. In other words, the band gaps of AlN, GaN, and InN satisfy the following relationship: AlN>GaN>InN.

In Example 1, first barrier layer 105 has a thickness of 20 nm and is composed of $Al_{0.27}Ga_{0.73}N$ having an Al composition ratio of 27%. Moreover, second barrier layer 106 has a thickness of 20 nm and is composed of $In_{0.04}Al_{0.23}Ga_{0.73}N$ having an In composition ratio of 4% and an Al composition ratio of 23%.

Thus, the In composition ratio of first barrier layer 105 is smaller than the In composition ratio of second barrier layer 106. Moreover, the Al composition ratio of first barrier layer 105 is greater than the Al composition ratio of second barrier layer 106. Furthermore, in Example 1, the Ga composition ratio of each of first barrier layer 105 and second barrier layer 106 is greater than 50%, more specifically, greater than 70%. According to such a relationship regarding composition ratio, the above-described relational expression (1) regarding average lattice constant can be satisfied for channel layer 104 consisting of GaN. It should be noted that although first barrier layer 105 and second barrier layer 106 have the same thickness and the same Ga composition ratio, the present disclosure is not limited to this example. The In composition ratio, the Al composition ratio, and the Ga composition ratio can be changed appropriately as long as the above-described relationship regarding average lattice constant is satisfied.

With the above-described configuration, in Example 1, tensile stress applied to first barrier layer 105 and second barrier layer 106 can be reduced. Accordingly, since an amount of piezoelectric polarization in the directly downward direction of gate electrode 121 is reduced, the electron density of second 2DEG 112 can be lower than the electron density of first 2DEG 111.

Figure 2:
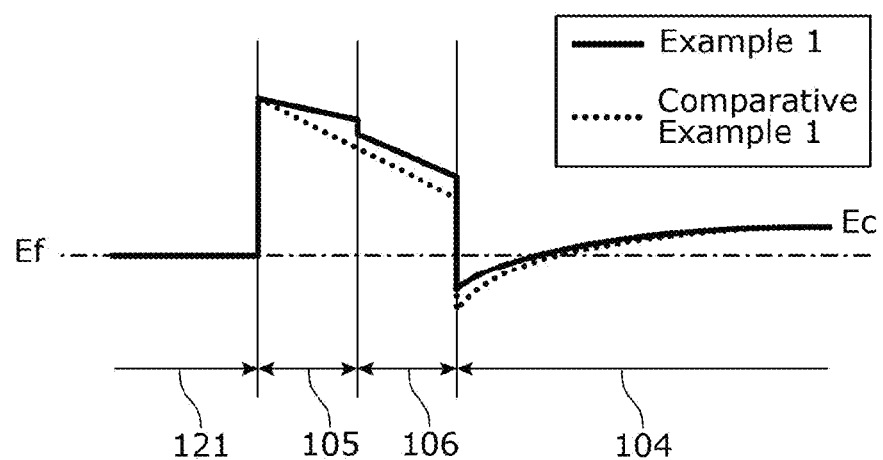
FIG. 2 is a schematic diagram of a conduction band of an energy band diagram of an area below a gate electrode of a semiconductor device according to Example 1 of Embodiment 1.

FIG. 2 is a schematic diagram of a conduction band of an energy band diagram of an area below gate electrode 121 of semiconductor device 100 according to Example 1 of Embodiment 1. In FIG. 2, as Comparative Example 1, a conduction band of an energy band diagram of an area below a gate electrode of a semiconductor device without second barrier layer 106 and first recessed portion 107 is illustrated by a broken line. It should be noted that in the semiconductor device according to Comparative Example 1, an upper face of channel layer 104 is flat and first barrier layer 105 is in contact with the upper face that is flat.

As illustrated in FIG. 2, the total amount of piezoelectric polarization in first barrier layer 105 and second barrier layer 106 in the directly downward direction of gate electrode 121 is reduced by embedding second barrier layer 106 in first recessed portion 107 directly below first barrier layer 105 in the directly downward direction of gate electrode 121. Therefore, it can be seen that a conduction band below second barrier layer 106 is raised and the electron density of second 2DEG 112 becomes lower than the electron density of first 2DEG 111. Thus, the electron density of second 2DEG 112 can be independently controlled without influencing the electron density of first 2DEG 111.

Example 2

In Example 2, the average lattice constant of channel layer 104 is less than the average lattice constant of second barrier layer 106 and greater than or equal to the average lattice constant of first barrier layer 105. In other words, regarding the average lattice constants, relational expression (2) below is satisfied.

(2) Second Barrier Layer 106>Channel Layer 104>First Barrier Layer 105

In Example 2, each of first barrier layer 105 and second barrier layer 106 consists of a group-III nitride semiconductor including Al and In. Specifically, first barrier layer 105 has a thickness of 5 nm and is composed of $In_{0.6}Al_{0.83}Ga_{0.11}N$ having an In composition ratio of 6% and an Al composition ratio of 83%. Moreover, second barrier layer 106 has a thickness of 5 nm and is composed of $In_{0.24}Al_{0.65}Ga_{0.11}N$ having an In composition ratio of 24% and an Al composition ratio of 65%.

Thus, the In composition ratio of first barrier layer 105 is less than the In composition ratio of second barrier layer 106. Moreover, the Al composition ratio of first barrier layer 105 is greater than the Al composition ratio of second barrier layer 106. Furthermore, in Example 2, the Ga composition ratio of each of first barrier layer 105 and second barrier layer 106 is less than 50%, more specifically, less than 20%. According to such a relationship regarding composition ratio, the above-described relational expression (2) regarding average lattice constant can be satisfied for channel layer 104 consisting of GaN. It should be noted that although first barrier layer 105 and second barrier layer 106 have the same thickness and the same Ga composition ratio, the present disclosure is not limited to this example. The In composition ratio, the Al composition ratio, and the Ga composition ratio can be changed appropriately as long as the above-described relationship regarding average lattice constant is satisfied.

With the above-described configuration, in Example 2, compressive stress can be applied to second barrier layer 106. Accordingly, the direction of piezoelectric polarization generated in second barrier layer 106 is inverted and the total amount of piezoelectric polarization in first barrier layer 105 and second barrier layer 106 is reduced. Therefore, it can be seen that a conduction band below second barrier layer 106 is raised and the electron density of second 2DEG 112 can be lower than the electron density of first 2DEG 111.

Figure 3:
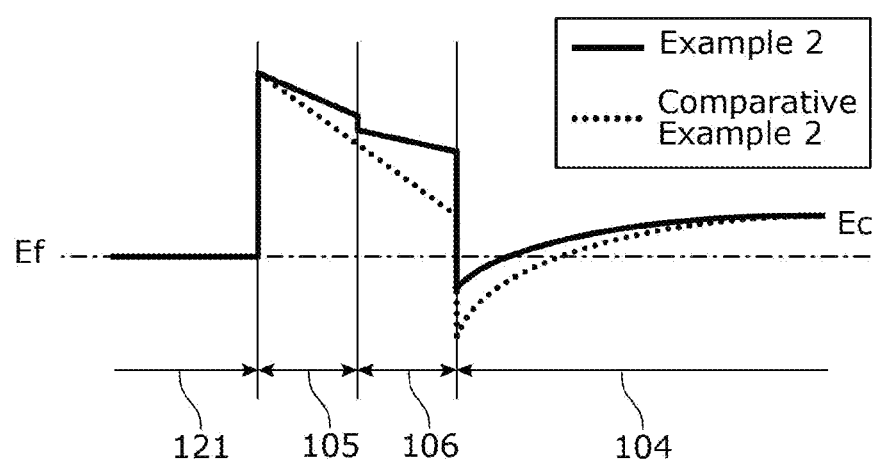
FIG. 3 is a schematic diagram of a conduction band of an energy band diagram of an area below a gate electrode of a semiconductor device according to Example 2 of Embodiment 1.

FIG. 3 is a schematic diagram of a conduction band of an energy band diagram of an area below gate electrode 121 of semiconductor device 100 according to Example 2 of Embodiment 1. In FIG. 3, as Comparative Example 2, a conduction band of an energy band diagram of an area below a gate electrode of a semiconductor device without second barrier layer 106 and first recessed portion 107 is illustrated by a broken line in the same manner as FIG. 2.

As illustrated in FIG. 3, the direction of piezoelectric polarization in the directly downward direction of gate electrode 121 is inverted by embedding second barrier layer 106 in first recessed portion 107 directly below first barrier layer 105 in the directly downward direction of gate electrode 121. Therefore, it can be seen that the electron density of second 2DEG 112 becomes lower than the electron density of first 2DEG 111. Thus, the electron density of second 2DEG 112 can be independently controlled without influencing the electron density of first 2DEG 111.

It should be noted that the film thickness and the element composition ratio of each of first barrier layer 105 and second barrier layer 106 described in Examples 1 and 2 are mere examples. For example, the film thickness of each of first barrier layer 105 and second barrier layer 106 may be an arbitrary layer thickness. However, it is preferred that the film thickness of each of first barrier layer 105 and second barrier layer 106 be adjusted so that the electron density of first 2DEG 111 and the electron density of second 2DEG 112 are saturated.

As described above, semiconductor device 100 according to the present embodiment includes: substrate 101; back-barrier layer 103 that is provided above substrate 101 and includes a group-III nitride semiconductor; channel layer 104 that is provided above back-barrier layer 103, includes a gallium nitride semiconductor, and has a band gap smaller than a band gap of back-barrier layer 103; first barrier layer 105 that is provided above channel layer 104, includes a group-III nitride semiconductor containing Al, and has a band gap larger than the band gap of channel layer 104; second barrier layer 106 that is provided to fill first recessed portion 107 provided in an upper face of channel layer 104, includes a group-III nitride semiconductor containing Al, and has a band gap larger than the band gap of channel layer 104; a two-dimensional electron gas that is generated on a channel layer side of an interface between channel layer 104 and first barrier layer 105 or second barrier layer 106; source electrode 122 and drain electrode 123 that are provided above first barrier layer 105, spaced apart from each other, and each electrically connected to the two-dimensional electron gas; and gate electrode 121 that is provided above second barrier layer 106 and spaced apart from source electrode 122 and drain electrode 123. An In composition ratio of first barrier layer 105 is greater than or equal to 0 and less than an In composition ratio of second barrier layer 106. An Al composition ratio of first barrier layer 105 is greater than or equal to an Al composition ratio of second barrier layer 106.

According to the above-described configuration, since first 2DEG 111 and second 2DEG 112 are generated in channel layer 104 in the vicinity of an interface between channel layer 104 and each of first barrier layer 105 and second barrier layer 106, a transistor using, as a channel, first 2DEG 111 and second 2DEG 112 generated can be realized. Moreover, since second barrier layer 106 is embedded in first recessed portion 107 below first barrier layer 105 in the directly downward direction of gate electrode 121, the distance between back-barrier layer 103 and second barrier layer 106 can be shortened. Therefore, when the transistor is OFF, a channel in channel layer 104 can be constricted.

Moreover, since second barrier layer 106 is provided, only the electron density of second 2DEG 112 can be independently controlled without influencing the electron density of first 2DEG 111. For example, the electron density of second 2DEG 112 can be lower than the electron density of first 2DEG 111 by adjusting the In composition ratio and the Al composition ratio of second barrier layer 106 within a range that satisfies the above-described relationship. Thus, when a drain voltage is applied during the transistor is OFF, a depletion layer becomes likely to spread in channel layer 104 in the directly downward direction of gate electrode 121 and the short-channel effect can be suppressed. Therefore, leakage current between source electrode 122 and drain electrode 123 when the transistor is OFF can be suppressed.

Moreover, in semiconductor device 100 according to the present embodiment, as described in Example 1, the average lattice constant of second barrier layer 106 may be less than the average lattice constant of channel layer 104 and greater than the average lattice constant of first barrier layer 105.

According to the above-described configuration, tensile stress applied to first barrier layer 105 and second barrier layer 106 can be reduced in the directly downward direction of gate electrode 121. Therefore, since the electron density of second 2DEG 112 in the directly downward direction of gate electrode 121 can be reduced, a depletion layer becomes likely to spread and the short-channel effect can be suppressed.

Moreover, in semiconductor device 100 according to the present embodiment, as described in Example 2, the average lattice constant of channel layer 104 may be less than the average lattice constant of second barrier layer 106 and greater than or equal to the average lattice constant of first barrier layer 105.

According to the above configuration, since compressive stress is applied to second barrier layer 106, the electron density of second 2DEG 112 in the directly downward direction of gate electrode 121 can be further reduced. Therefore, a depletion layer becomes likely to spread and the short-channel effect can be further suppressed.

Variation of Embodiment 1

Next, a variation of Embodiment 1 is described.

The variation described below is different from Embodiment 1 in that a recessed portion is provided in a first barrier layer. In other words, a second recessed portion is provided below gate electrode 121. Hereinafter, the description focuses on the difference from Embodiment 1, and description regarding common points with Embodiment 1 is omitted or simplified.

Figure 4:
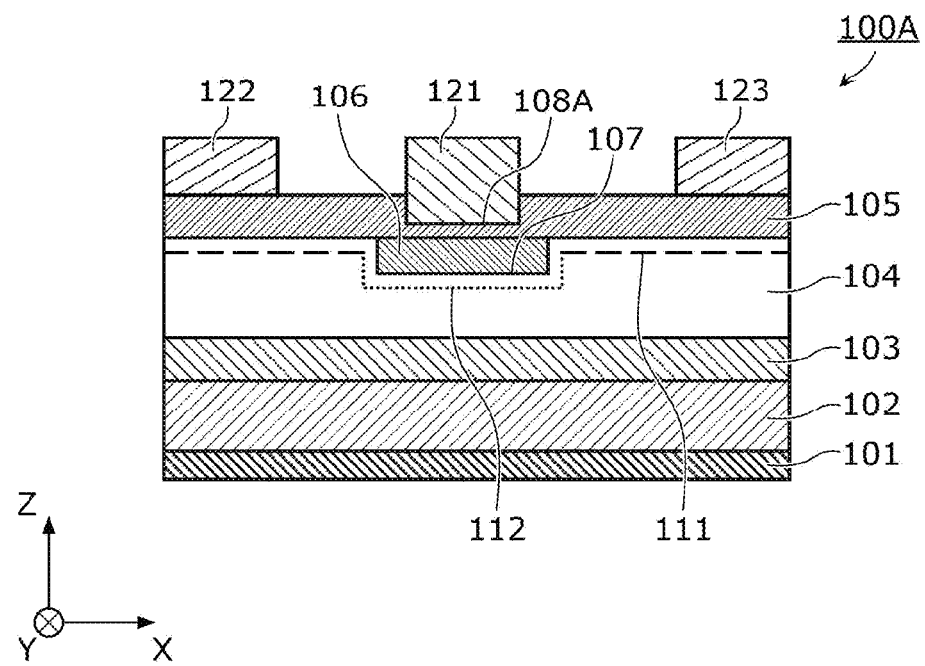
FIG. 4 is a cross-sectional view illustrating a configuration of a semiconductor device according to Variation 1 of Embodiment 1.

First, Variation 1 is described with reference to FIG. 4. FIG. 4 is a cross-sectional view illustrating a configuration of semiconductor device 100A according to Variation 1 of Embodiment 1. As illustrated in FIG. 4, in semiconductor device 100A according to Variation 1, second recessed portion 108A is provided in an upper face of first barrier layer 105 below gate electrode 121. Second recessed portion 108A is formed mainly by removing a portion of first barrier layer 105 below gate electrode 121.

Second recessed portion 108A is a recessed portion that is recessed from the upper face of first barrier layer 105 (here, an interface between first barrier layer 105 and source electrode 122 or drain electrode 123) toward a substrate 101 side. Second recessed portion 108A is provided at a position overlapping gate electrode 121 in the plan view.

In the present variation, a cross-sectional shape (XZ cross section) of second recessed portion 108A is rectangular as illustrated in FIG. 4. Namely, a bottom face of second recessed portion 108A is parallel to the main face of substrate 101. Moreover, a lateral face of second recessed portion 108A is perpendicular to the main face of substrate 101. It should be noted that the shape of second recessed portion 108A is not limited to a rectangle. For example, a lateral face of second recessed portion 108A may be sloped with respect to the main face of substrate 101.

The width of second recessed portion 108A in the gate length direction (X-axis direction) is shorter than that of first recessed portion 107. Second recessed portion 108A is provided so as not to protrude from first recessed portion 107 toward each of a source electrode 122 side and a drain electrode 123 side, in the plan view.

In the present variation, gate electrode 121 is in contact with the bottom face of second recessed portion 108A. Gate electrode 121 is provided so as to fill second recessed portion 108A. It should be noted that a portion of gate electrode 121 may be provided so as to protrude from second recessed portion 108A toward the source electrode 122 side or the drain electrode 123 side.

As described above, in semiconductor device 100A according to the present variation, second recessed portion 108A is provided in the upper face of first barrier layer 105 below gate electrode 121, and gate electrode 121 is in contact with the bottom face of second recessed portion 108A.

Thus, since second recessed portion 108A is provided, the electron density of second 2DEG 112 in the directly downward direction of second recessed portion 108A can be reduced and a space between gate electrode 121 and second 2DEG 112 can be shortened. Therefore, since a depletion layer becomes further likely to spread, the short-channel effect can be further suppressed.

Figure 5:
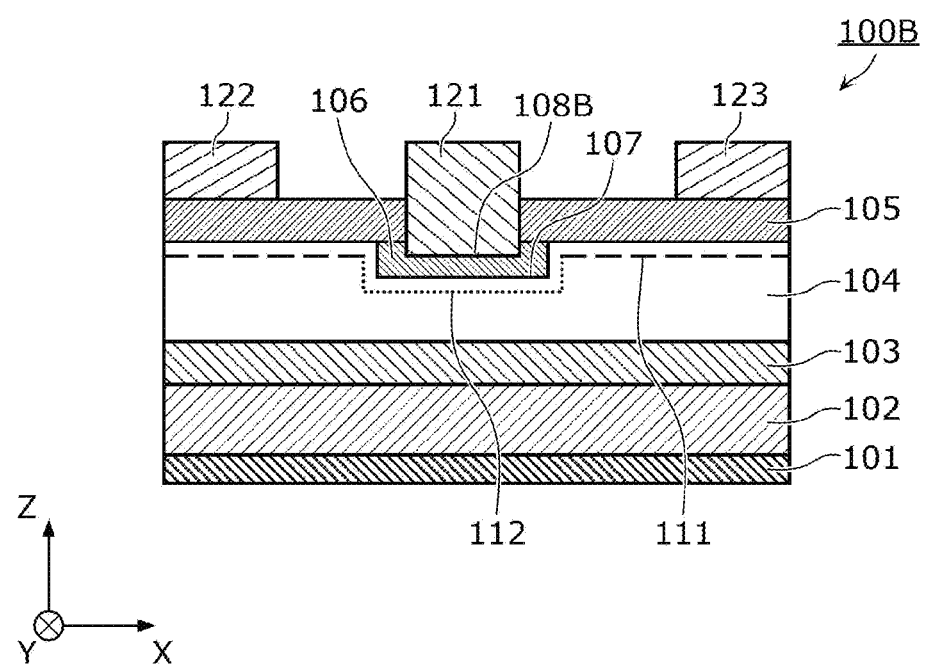
FIG. 5 is a cross-sectional view illustrating a configuration of a semiconductor device according to Variation 2 of Embodiment 1.

Next, Variation 2 is described with reference to FIG. 5. FIG. 5 is a cross-sectional view illustrating a configuration of semiconductor device 100B according to Variation 2 of Embodiment 1. As illustrated in FIG. 5, in semiconductor device 100B according to Variation 2, second recessed portion 108B is provided in an upper face of first barrier layer 105 below gate electrode 121 in the same manner as FIG. 4. Second recessed portion 108B penetrates first barrier layer 105. Specifically, second recessed portion 108B is formed mainly by removing the whole of first barrier layer 105 below gate electrode 121 and a portion of second barrier layer 106. Second recessed portion 108B has the same feature as that of second recessed portion 108A illustrated in FIG. 4, with the exception that the length in the depth direction (Z-axis direction) is different between second recessed portion 108B and second recessed portion 108A.

In the present variation, gate electrode 121 is in contact with second barrier layer 106. It should be noted that a space between a bottom portion of gate electrode 121 and second 2DEG 112 is, for example, greater than or equal to 3 nm and less than or equal to 15 nm. Therefore, second 2DEG 112 is not disappeared and can be caused to function as a channel.

As described above, in semiconductor device 100B according to the present variation, second recessed portion 108B penetrates first barrier layer 105 and gate electrode 121 is in contact with second barrier layer 106.

Thus, the electron density of second 2DEG 112 in the directly downward direction of second recessed portion 108B can be lower than that in the configuration illustrated in FIG. 4. Moreover, the space between the bottom portion of gate electrode 121 and second 2DEG 112 can be further shortened. Therefore, a depletion layer becomes further likely to spread. Moreover, since the space between the bottom portion of gate electrode 121 and second 2DEG 112 can be further shortened, the transconductance (gm) of a transistor can be improved and the responsiveness of the transistor can be increased.

It should be noted that in Variation 2, second recessed portion 108B may only penetrate first barrier layer 105. In other words, a portion of second barrier layer 106 is not necessarily removed when second recessed portion 108B is formed. In this case, a bottom face of second recessed portion 108B may be flush with an interface between first barrier layer 105 and second barrier layer 106.

Embodiment 2

Next, Embodiment 2 is described.

In Embodiment 2, the relative positional relationship between a gate electrode and a second barrier layer is different from that in Embodiment 1. Hereinafter, the description focuses on the difference from Embodiment 1, and description regarding common points with Embodiment 1 is omitted or simplified.

First, the positional relationship between gate electrode 121 and second barrier layer 106 in semiconductor device 100 illustrated in FIG. 1 and the advantageous effect thereof is described with reference to FIG. 1.

In semiconductor device 100 illustrated in FIG. 1 in the plan view, second barrier layer 106 protrudes, by a first length that is limited, from a drain electrode 123-side end portion (drain electrode-side end) of gate electrode 121 toward a drain electrode 123 side. The first length corresponds to distance $D_{BD}$ illustrated in FIG. 1. The drain electrode 123-side end portion of gate electrode 121 is, within the outline of gate electrode 121 in the plan view, a portion closest to drain electrode 123.

Thus, 2 DEG generated in the directly downward direction of an end portion of gate electrode 121 becomes second 2DEG 112 and electron density thereof becomes low. Therefore, electric field concentrated at the drain electrode 123-side end portion of gate electrode 121 can be alleviated. Accordingly, off-state leakage current between gate electrode 121 and drain electrode 123 can be reduced.

Moreover, in Embodiment 1, second barrier layer 106 protrudes, by a second length that is limited, from a source electrode 122-side end portion (source electrode-side end) of gate electrode 121 toward a source electrode 122 side. The second length corresponds to distance $D_{BS}$ illustrated in FIG. 1. The source electrode 122-side end portion of gate electrode 121 is, within the outline of gate electrode 121 in the plan view, a portion closest to source electrode 122.

In the example illustrated in FIG. 1, the first length (distance $D_{BD}$) and the second length (distance $D_{BS}$) are the same length. It should be noted that the first length (distance $D_{BD}$) is, for example, less than or equal to half of the distance between gate electrode 121 and drain electrode 123, and may be less than or equal to one-fourth of the distance between gate electrode 121 and drain electrode 123. Since the first length is not too long, it is possible to prevent second 2DEG 112 having low electron density and high on-state resistance from spreading too much. Therefore, increase of on-state resistance when the transistor is ON can be suppressed. Moreover, the second length (distance $D_{BS}$) is, for example, less than or equal to half of the distance between gate electrode 121 and source electrode 122, and may be less than or equal to one-fourth of the distance between gate electrode 121 and source electrode 122. Since the second length is not too long, it is possible to prevent second 2DEG 112 having low electron density and high on-state resistance from spreading too much. Therefore, increase of on-state resistance when the transistor is ON can be suppressed.

It should be noted that when a field plate electrode not described in the present embodiment is provided between gate electrode 121 and drain electrode 123, second barrier layer 106 may protrude from a drain electrode 123-side end portion of the field plate electrode toward the drain electrode 123 side. In this case, second barrier layer 106 may be provided continuously or discontinuously. Alternatively, the thickness of second barrier layer 106 may be increased or decreased appropriately by changing the depth of first recessed portion 107. Thus, current collapse can be reduced.

As described above, off-state leakage current between gate electrode 121 and drain electrode 123 can be reduced also in semiconductor device 100 according to Embodiment 1. Moreover, with a semiconductor device according to the present embodiment described below with reference to FIG. 6, off-state leakage current can be further effectively reduced.

Figure 6:
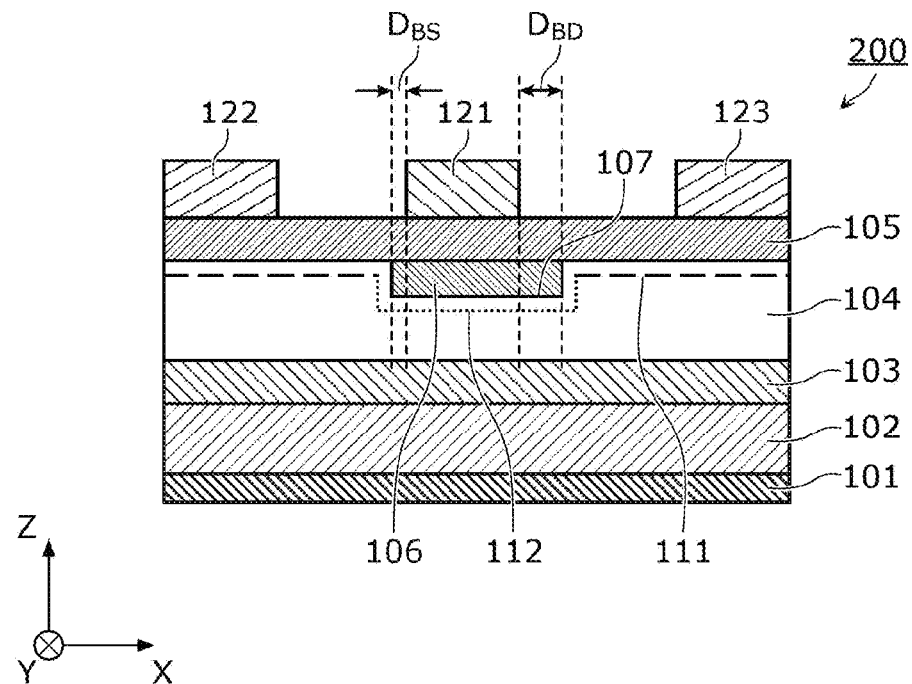
FIG. 6 is a cross-sectional view illustrating a configuration of a semiconductor device according to Embodiment 2.

FIG. 6 is a cross-sectional view illustrating a configuration of semiconductor device 200 according to Embodiment 2. As illustrated in FIG. 6, in semiconductor device 200 according to Embodiment 2, a first length (distance $D_{BD}$) is longer than a second length (distance $D_{BS}$). Thus, electric field concentrated at a drain electrode 123-side end portion of gate electrode 121 can be further alleviated, and off-state leakage current between gate electrode 121 and drain electrode 123 can be reduced.

As described above, in semiconductor device 200 according to the present embodiment in the plan view of substrate 101, second barrier layer 106 protrudes, by the first length (distance $D_{BD}$) that is limited, from the drain electrode 123-side end of gate electrode 121 toward a drain electrode 123 side.

According to the above-described configuration, second 2DEG 112 having low electron density extends toward the drain electrode 123 side. Therefore, concentration of electric field at the drain electrode 123-side end portion of gate electrode 121 can be alleviated, and leakage current between gate electrode 121 and drain electrode 123 can be suppressed.

Moreover, in semiconductor device 200 according to the present embodiment in the plan view of substrate 101, second barrier layer 106 protrudes, by the second length (distance $D_{BS}$) that is limited, from a source electrode 122-side end of gate electrode 121 toward a source electrode 122 side, and the first length (distance $D_{BD}$) is longer than the second length (distance $D_{BS}$).

According to the above-described configuration, second 2DEG 112 having low electron density extends toward each of the drain electrode 123 side and the source electrode 122 side. Therefore, concentration of electric field at both of the drain electrode 123-side end portion and the source electrode 122-side end portion of gate electrode 121 can be alleviated, and leakage current between gate electrode 121 and drain electrode 123 and leakage current between gate electrode 121 and source electrode 122 can be suppressed.

Moreover, when a transistor is OFF, a higher voltage difference is likely to occur between a gate and a drain as compared to between the gate and a source. Therefore, since the first length (distance $D_{BD}$) of second barrier layer 106 protruding toward the drain electrode 123 side is longer than the second length (distance $D_{BS}$) of second barrier layer 106 protruding toward the source electrode 122 side, the effect of alleviating electric field at the drain electrode 123-side end portion of gate electrode 121 at which electric field is likely to concentrate can be enhanced, and the effect of suppressing leakage current can be enhanced.

Variation of Embodiment 2

Next, a variation of Embodiment 2 is described.

In the variation described blow, the relative positional relationship between a gate electrode and a second barrier layer is different from that in Embodiments 1 and 2. Hereinafter, the description focuses on the difference from Embodiments 1 and 2, and description regarding common points with Embodiments 1 and 2 is omitted or simplified.

Figure 7:
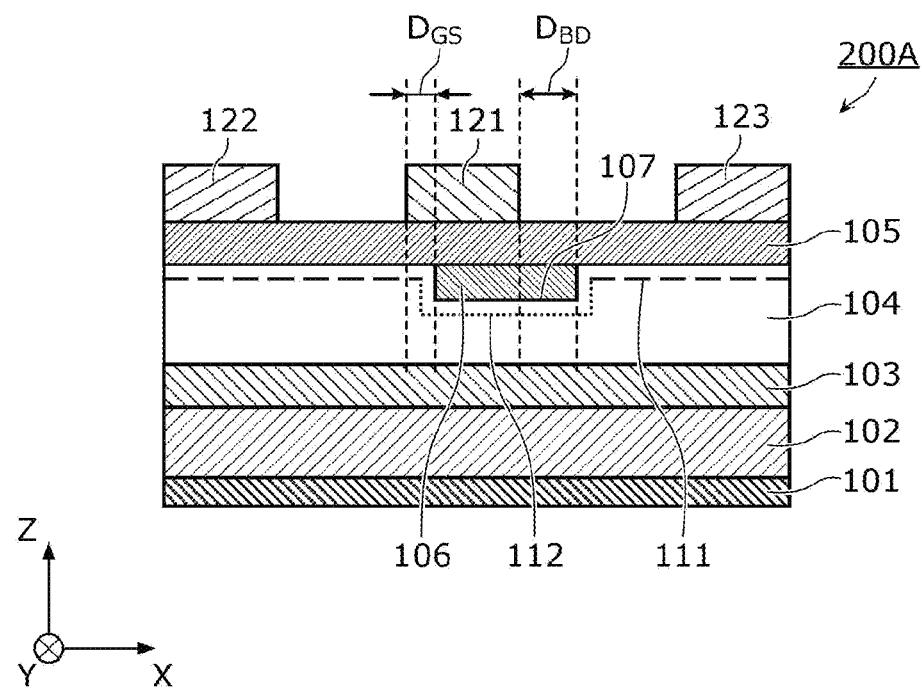
FIG. 7 is a cross-sectional view illustrating a configuration of a semiconductor device according to Variation 1 of Embodiment 2.

First, Variation 1 is described with reference to FIG. 7. FIG. 7 is a cross-sectional view illustrating a configuration of semiconductor device 200A according to Variation 1 of Embodiment 2. As illustrated in FIG. 7, in semiconductor device 200A according to Variation 1, gate electrode 121 protrudes from a source electrode 122-side end portion (source electrode-side end) of second barrier layer 106 toward a source electrode 122 side. Specifically, gate electrode 121 protrudes by a third length that is limited. The third length corresponds to distance Des illustrated in FIG. 7. The source electrode 122-side end portion of second barrier layer 106 is, within the outline of second barrier layer 106 in the plan view, a portion closest to source electrode 122.

According to this configuration, second barrier layer 106 is not located in the directly downward direction of a source electrode 122-side end portion of gate electrode 121. First 2DEG 111 is generated in the directly downward direction of the source electrode 122-side end portion of gate electrode 121.

As illustrated in FIG. 7, distance Des is shorter than distance $D_{BD}$. Since gate electrode 121 is not too close to source electrode 122, concentration of gate-source electric field can be alleviated and leakage current between gate electrode 121 and source electrode 122 can be reduced. It should be noted that distance Dos may be longer than or equal to distance $D_{BD}$.

As described above, in semiconductor device 200A according to Variation 1 in the plan view of substrate 101, gate electrode 121 protrudes from the source electrode 122-side end of second barrier layer 106 toward the source electrode 122 side.

Thus, first 2DEG 111 between gate electrode 121 and source electrode 122 extends to a portion overlapping the source electrode 122-side end portion of gate electrode 121, in the plan view. First 2DEG 111 is an area having high electron density and low resistance. Therefore, since first 2DEG 111 having high electron density extends long and second 2DEG 112 having low electron density becomes short, on-state resistance can be reduced.

Meanwhile, since second barrier layer 106 is provided so as to protrude from gate electrode 121 on a drain electrode 123 side, electric field concentrated at a drain electrode 123-side end portion of gate electrode 121 can be alleviated. Thus, on-state resistance can be reduced while reducing off-state leakage current by alleviating electric field.

Next, Variation 2 is described with reference to FIG. 8.

Figure 8:
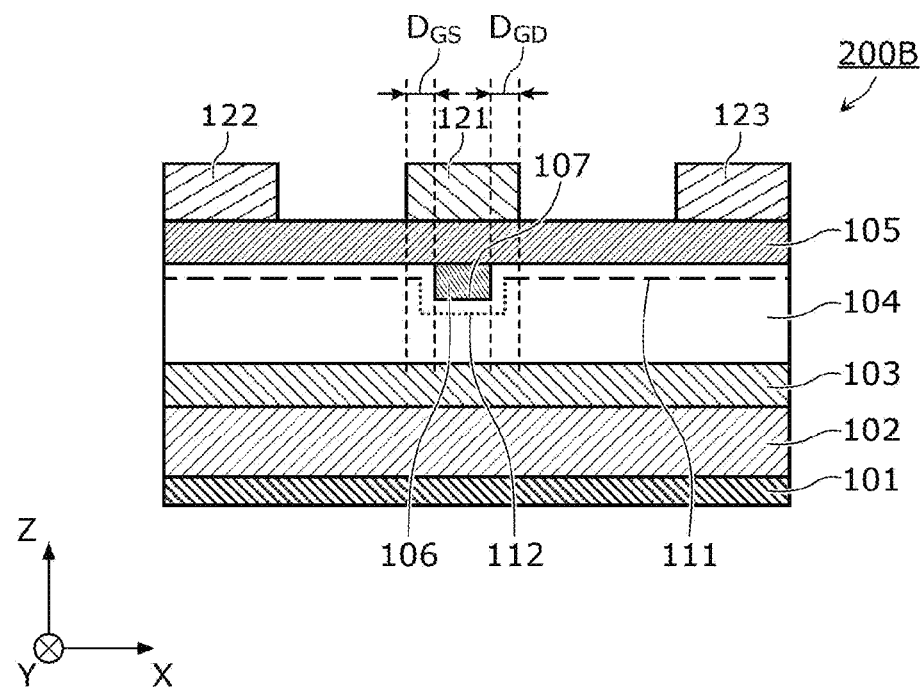
FIG. 8 is a cross-sectional view illustrating a configuration of a semiconductor device according to Variation 2 of Embodiment 2.

FIG. 8 is a cross-sectional view illustrating a configuration of semiconductor device 200B according to Variation 2 of Embodiment 2. As illustrated in FIG. 8, in semiconductor device 200B according to Variation 2, gate electrode 121 protrudes from second barrier layer 106 toward both of a source electrode 122 side and a drain electrode 123 side.

Specifically, in the same manner as semiconductor device 200A in FIG. 7, gate electrode 121 protrudes, by a third length (distance $D_{GS}$) that is limited, from a source electrode 122-side end portion (source electrode-side end) of second barrier layer 106 toward the source electrode 122 side. Moreover, gate electrode 121 protrudes, by a fourth length that is limited, from a drain electrode 123-side end portion (drain electrode-side end) of second barrier layer 106 toward the drain electrode 123 side. The fourth length corresponds to distance $D_{GD}$ illustrated in FIG. 8. The drain electrode 123-side end portion of second barrier layer 106 is, within the outline of second barrier layer 106 in the plan view, a portion closest to drain electrode 123.

Although distance Des is equal to distance $D_{GD}$ as illustrated in FIG. 8, the present disclosure is not limited to this example. Distance Des may be shorter than distance $D_{GD}$ or longer than distance $D_{BD}$. For example, by causing distance Dos to be longer than distance $D_{GD}$, on-state resistance can be reduced while alleviating concentration of electric field on the drain electrode 123 side.

As described above, in semiconductor device 200B according to Variation 2 in the plan view of substrate 101, gate electrode 121 protrudes from the drain electrode 123-side end of second barrier layer 106 toward the drain electrode 123 side. Moreover, in semiconductor device 200B in the plan view of substrate 101, in the same manner as semiconductor device 200A, gate electrode 121 protrudes from the source electrode 122-side end of second barrier layer 106 toward the source electrode 122 side.

Thus, in the plan view, first 2DEG 111 between gate electrode 121 and source electrode 122 and first 2DEG 111 between gate electrode 121 and drain electrode 123 extend to a portion overlapping a source electrode 122-side end portion of gate electrode 121 and a portion overlapping a drain electrode 123-side end portion of gate electrode 121, respectively. Therefore, since first 2DEG 111 having high electron density extends on each of the source electrode 122 side and the drain electrode 123 side and second 2DEG 112 having low electron density becomes short, on-state resistance can be reduced.

It should be noted that also in semiconductor device 200, 200A, or 200B according to the present embodiment or variation thereof, second recessed portion 108A according to Variation 1 of Embodiment 1 may be provided so that a portion of gate electrode 121 is embedded in first barrier layer 105. Moreover, in semiconductor device 200, second recessed portion 108B according to Variation 2 of Embodiment 1 may be provided so that gate electrode 121 is in contact with second barrier layer 106. A depletion layer becomes likely to spread and off-state leakage current of the transistor can be reduced.

Embodiment 3

Next, Embodiment 3 is described.

In Embodiment 3, the shape of a second barrier layer is different from that in Embodiment 1. Hereinafter, the description focuses on the difference from Embodiment 1, and description regarding common points with Embodiment 1 is omitted or simplified.

Figure 9:
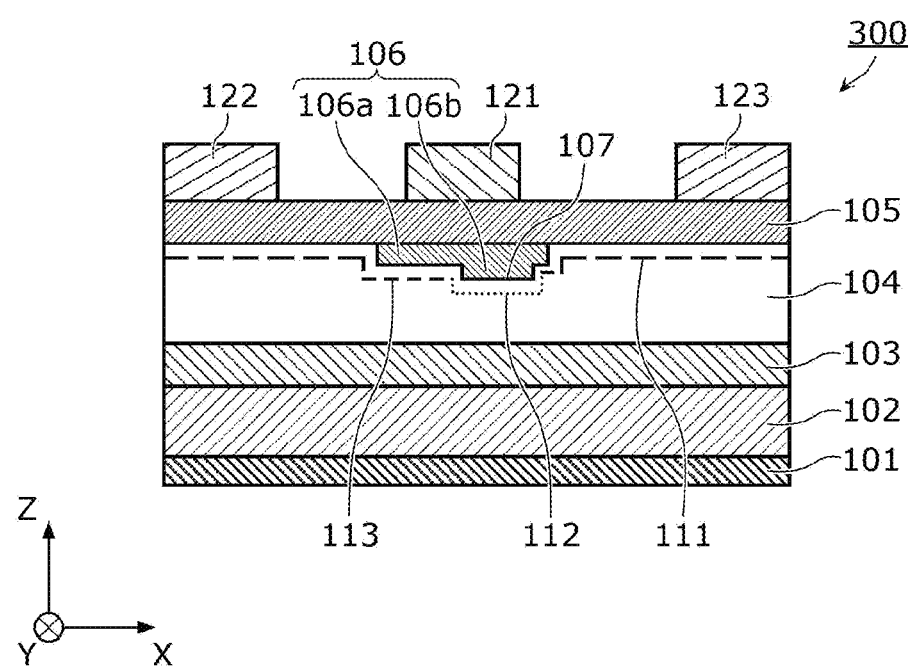
FIG. 9 is a cross-sectional view illustrating a configuration of a semiconductor device according to Embodiment 3.

FIG. 9 is a cross-sectional view illustrating a configuration of semiconductor device 300 according to Embodiment 3. As illustrated in FIG. 9, in semiconductor device 300 according to Embodiment 3, the thickness of second barrier layer 106 is thinner on a source electrode 122 side, as compared to that on a drain electrode 123 side. Specifically, in the plan view, second barrier layer 106 is thicker at a position of a drain electrode 123-side end portion (drain electrode-side end) of gate electrode 121 than at a position of a source electrode 122-side end portion (source electrode-side end) of gate electrode 121.

More specifically, as illustrated in FIG. 9, second barrier layer 106 includes thin portion 106a and thick portion 106b that is thicker than thin portion 106a. Thin portion 106a overlaps the position of the source electrode 122-side end portion of gate electrode 121, in the plan view. Thick portion 106b overlaps the position of the drain electrode 123-side end portion of gate electrode 121, in the plan view.

Second barrier layer 106 having uneven thickness is formed by forming a step in a bottom face of first recessed portion 107. First recessed portion 107 having the step in the bottom face is formed by, for example, etching channel layer 104 stepwise.

Thus, since the thickness of second barrier layer 106 is uneven, the electron density of 2DEG generated in the vicinity of an interface between second barrier layer 106 and channel layer 104 becomes uneven. Specifically, the electron density of third 2DEG 113 on the source electrode 122 side can be higher than the electron density of second 2DEG 112 on the drain electrode 123 side. Therefore, on-state resistance can be reduced while alleviating electric field at the drain electrode 123-side end portion of gate electrode 121 and reducing off-state leakage current between gate electrode 121 and drain electrode 123.

It should be noted that although second barrier layer 106 includes a thin portion on the drain electrode 123 side with respect to thick portion 106b in the example illustrated in FIG. 9, the present disclosure is not limited to this example. Thick portion 106b may extend to a drain electrode 123-side end portion of second barrier layer 106.

As described above, in semiconductor device 300 according to the embodiment in the plan view of substrate 101, the thickness of second barrier layer 106 is thicker at the position of the drain electrode 123-side end of gate electrode 121 than at the position of the source electrode 122-side end of gate electrode 121.

Accordingly, third 2DEG 113 having electron density higher than that of second 2DEG 112 on the drain electrode 123 side is generated on the source electrode 122 side. Therefore, both reduction in on-state resistance and reduction in off-state leakage current by alleviating electric field on the drain electrode 123 side can be achieved.

Variation of Embodiment 3

Next, a variation of Embodiment 3 is described.

In the following variation, the shape of a lateral face of a second barrier layer is different from that in Embodiment 1. Hereinafter, the description focuses on the difference from Embodiment 1, and description regarding common points with Embodiment 1 is omitted or simplified.

Figure 10:
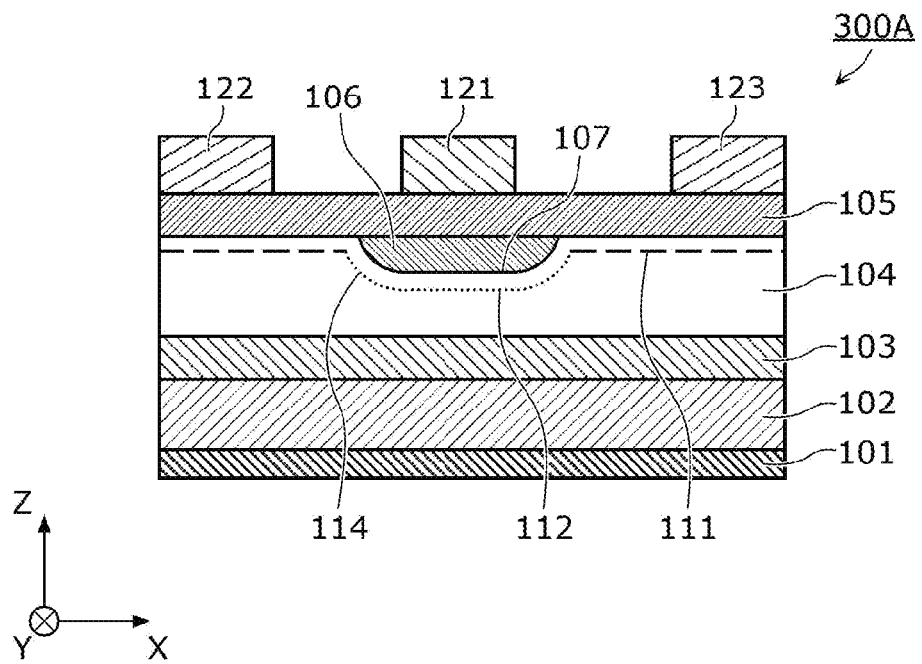
FIG. 10 is a cross-sectional view illustrating a configuration of a semiconductor device according to a variation of Embodiment 3.

FIG. 10 is a cross-sectional view illustrating a configuration of semiconductor device 300A according to the variation of Embodiment 3. As illustrated in FIG. 10, in semiconductor device 300A according to the variation, a lateral face of second barrier layer 106 is sloped. Specifically, a source electrode 122-side lateral face and a drain electrode 123-side lateral face of second barrier layer 106 are sloped so as to cause each of the space between the source electrode 122-side lateral face and first barrier layer 105 and the space between the drain electrode 123-side lateral face and first barrier layer 105 to increase from a corresponding one of end portions toward a central portion of second barrier layer 106.

The lateral face sloped is, for example, a sloped face curved smoothly. The sloped face is curved to protrude downward. It should be noted that the lateral face sloped may be a flat face. Moreover, one of the source electrode 122-side lateral face or the drain electrode 123-side lateral face is not necessarily sloped.

The slope angle of the lateral face of second barrier layer 106 is an acute angle with respect to a lower face of first barrier layer 105. It should be noted that the slope angle is represented by the angle between the lateral face and a contact face of second barrier layer 106 with first barrier layer 105. The slope angle of the lateral face of second barrier layer 106 is, for example, less than or equal to 45 degrees, and may be 30 degrees. It should be noted that on-state resistance can be reduced as the slope angle is decreased.

Fourth 2DEG 114 is generated on a channel layer 104 side of an interface between channel layer 104 and the lateral face sloped. Since the thickness of second barrier layer 106 becomes thin at each of a source electrode 122-side end portion and a drain electrode 123-side end portion due to the slope of the lateral face, the electron density of fourth 2DEG 114 in the vicinity of each of the source electrode 122-side end portion and the drain electrode 123-side end portion becomes high. Therefore, on-state resistance can be reduced. Moreover, since fourth 2DEG 114 is generated along the shape of the lateral face sloped, first 2DEG 111 and second 2DEG 112 can be connected smoothly. Therefore, electron scattering in 2DEG can be suppressed and on-state resistance can be reduced.

As described above, in semiconductor device 300A according to the present variation, the source electrode 122-side lateral face or the drain electrode 123-side lateral face of second barrier layer 106 is sloped so as to cause the space between the source electrode 122-side lateral face or the drain electrode 123-side lateral face and the lower face of first barrier layer 105 to increase from an end portion toward a central portion of second barrier layer 106, and the angle between the source electrode 122-side lateral face or the drain electrode 123-side lateral face of second barrier layer 106 and the lower face of first barrier layer 105 is an acute angle.

Thus, electron scattering in 2DEG as a channel caused by a step of second barrier layer 106 is suppressed and on-state resistance can be reduced. Moreover, since the electron density of fourth 2DEG 114 can be higher than the electron density of second 2DEG 112 by causing the lateral face of second barrier layer 106 to be sloped at an acute angle, on-state resistance can be reduced.

It should be noted that also in semiconductor device 300 or 300A according to the present embodiment or variation thereof, second recessed portion 108A according to Variation 1 of Embodiment 1 may be provided so that a portion of gate electrode 121 is embedded in first barrier layer 105. Moreover, in semiconductor device 300 or 300A, second recessed portion 108B according to Variation 2 of Embodiment 1 may be provided so that gate electrode 121 is in contact with second barrier layer 106. A depletion layer becomes likely to spread and off-state leakage current of a transistor can be reduced. Moreover, in semiconductor device 300 or 300A, the positional relationship between second barrier layer 106 and gate electrode 121 may satisfy the positional relationship described in Embodiment 2 or variation thereof.

Embodiment 4

Next, Embodiment 4 is described.

Embodiment 4 is different from Embodiment 1 in that a first barrier layer includes a spacer layer. Hereinafter, the description focuses on the difference from Embodiment 1, and description regarding common points with Embodiment 1 is omitted or simplified.

Figure 11:
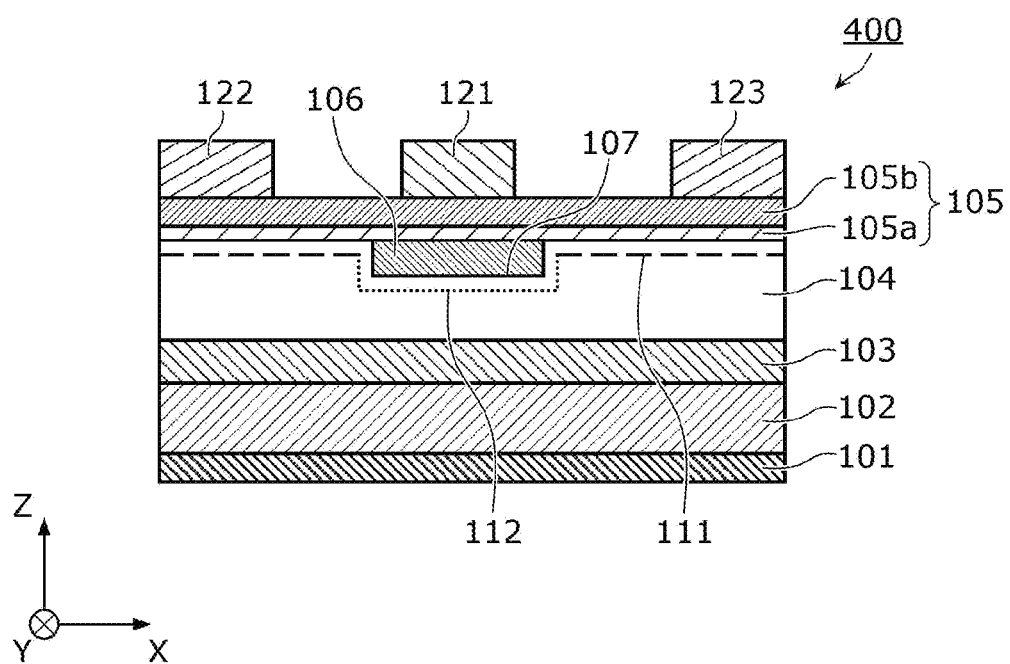
FIG. 11 is a cross-sectional view illustrating a configuration of a semiconductor device according to Embodiment 4.

FIG. 11 is a cross-sectional view illustrating a configuration of semiconductor device 400 according to Embodiment 4. As illustrated in FIG. 11, in semiconductor device 400 according to Embodiment 4, the number of layers constituting first barrier layer 105 is two or more. Specifically, first barrier layer 105 includes spacer layer 105a and barrier layer 105b. Barrier layer 105b has, for example, the same configuration as that of first barrier layer 105 described in Embodiments 1 to 3.

Spacer layer 105a is the lowest layer among the layers constituting first barrier layer 105. Spacer layer 105a has a band gap larger than the band gap of any one of the layers other than spacer layer 105a in first barrier layer 105. In the example illustrated in FIG. 10, spacer layer 105a has a band gap larger than both of the band gap of barrier layer 105b and the band gap of channel layer 104. For example, spacer layer 105a may have the largest band gap among the layers constituting first barrier layer 105.

For example, spacer layer 105a is AlN having a thickness of 2 nm and an Al composition ratio of 100%. It should be noted that the Al composition ratio of spacer layer 105a may be within a range of at least 30% and less than 100%. Moreover, the thickness of spacer layer 105a may be an arbitrary film thickness.

Furthermore, although spacer layer 105a contacts and covers an upper face of second barrier layer 106 in the example illustrated in FIG. 11, the present disclosure is not limited to this example. In first barrier layer 105, spacer layer 105a is not necessarily provided at a portion that contacts the upper face of second barrier layer 106. In this case, barrier layer 105b contacts the upper face of second barrier layer 106.

Moreover, spacer layer 105a may be provided on at least one of a lateral face or a bottom face of second barrier layer 106. In this case, spacer layer 105a that contacts the upper face of second barrier layer 106 is not necessarily provided.

As described above, in semiconductor device 400 according to the present embodiment, first barrier layer 105 is composed of a plurality of layers including spacer layer 105a as the lowest layer. Spacer layer 105a has a band gap larger than the band gap of any one of the layers other than spacer layer 105a in first barrier layer 105.

Thus, resistance can be reduced by improving the mobility of electrons in the directly downward direction of first barrier layer 105 that is located at a portion other than a portion in the directly downward direction of gate electrode 121, and off-state leakage current between gate electrode 121 and drain electrode 123 can be reduced since the potential of first barrier layer 105 becomes high in the directly downward direction of gate electrode 121.

Variation of Embodiment 4

Next, a variation of Embodiment 4 is described.

The variation described below is different from Embodiment 4 in that a recessed portion is provided in a first barrier layer. Hereinafter, the description focuses on the difference from Embodiment 4, and description regarding common points with Embodiment 4 is omitted or simplified.

Figure 12:
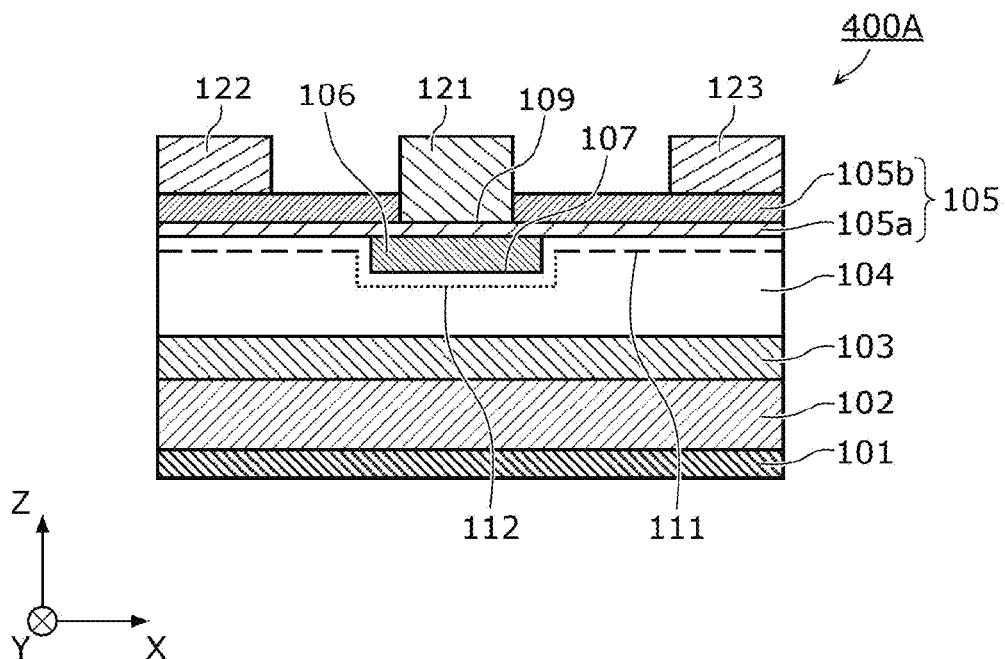
FIG. 12 is a cross-sectional view illustrating a configuration of a semiconductor device according to a variation of Embodiment 4.

FIG. 12 is a cross-sectional view illustrating a configuration of semiconductor device 400A according to the variation of Embodiment 4. As illustrated in FIG. 12, in semiconductor device 400A according to the variation, third recessed portion 109 extending to spacer layer 105a is provided in an upper face of first barrier layer 105 below gate electrode 121.

Third recessed portion 109 penetrates, among the layers constituting first barrier layer 105, a layer other than spacer layer 105a. In the example illustrated in FIG. 12, third recessed portion 109 penetrates barrier layer 105b. A bottom face of third recessed portion 109 is flush with an interface between spacer layer 105a and barrier layer 105b. It should be noted that third recessed portion 109 may be formed by removing a portion of spacer layer 105a. In other words, the bottom face of third recessed portion 109 may be located below the interface between spacer layer 105a and barrier layer 105b. The shape and arrangement of third recessed portion 109 are the same as those of second recessed portion 108A or 108B according to a variation of Embodiment 1.

As illustrated in FIG. 12, gate electrode 121 is in contact with the bottom face of third recessed portion 109. In other words, gate electrode 121 is in contact with spacer layer 105a.

As described above, in semiconductor device 400A according to the present embodiment, third recessed portion 109 extending to spacer layer 105a is provided in the upper face of first barrier layer 105 below gate electrode 121, and gate electrode 121 is in contact with the bottom face of third recessed portion 109.

Thus, a Schottky barrier becomes high and off-state leakage current between gate electrode 121 and drain electrode 123 can be further reduced.

It should be noted that also in semiconductor device 400 or 400A according to the present embodiment or variation thereof, second recessed portion 108A according to Variation 1 of Embodiment 1 may be provided instead of third recessed portion 109 so that a portion of gate electrode 121 is embedded in first barrier layer 105. Moreover, in semiconductor device 400 or 400A, second recessed portion 108B according to Variation 2 of Embodiment 1 may be provided instead of third recessed portion 109 so that gate electrode 121 is in contact with second barrier layer 106. A depletion layer becomes likely to spread and off-state leakage current of a transistor can be reduced. Moreover, in semiconductor device 400 or 400A, the positional relationship between second barrier layer 106 and gate electrode 121 may satisfy the positional relationship described in Embodiment 2 or variation thereof. Furthermore, in semiconductor device 400 or 400A, the shape of second barrier layer 106 may be the shape described in Embodiment 3 or variation thereof.

(Method for Manufacturing Semiconductor Device According to Each Embodiment and Each Variation)

Next, a method for manufacturing a semiconductor device according to each embodiment and each variation is described. Hereinafter, the description focuses on a method for manufacturing semiconductor device 100 according to Embodiment 1 illustrated in FIG. 1. It should be noted that since only the thickness, Al composition ratio, and In composition ratio of each of channel layer 104, first barrier layer 105, and second barrier layer 106 are different between a semiconductor device according to Example 1 of Embodiment 1 and a semiconductor device according to Example 2 of Embodiment 1, a method for manufacturing the semiconductor device according to Example 1 of Embodiment 1 is described as a representative example.

Hereinafter, the method for manufacturing semiconductor device 100 according to Embodiment 1 is described with reference to FIG. 13A to FIG. 13E.

Each of FIG. 13A to FIG. 13E is a cross-sectional view illustrating a configuration of semiconductor device 100 during manufacturing.

Figure 13A:
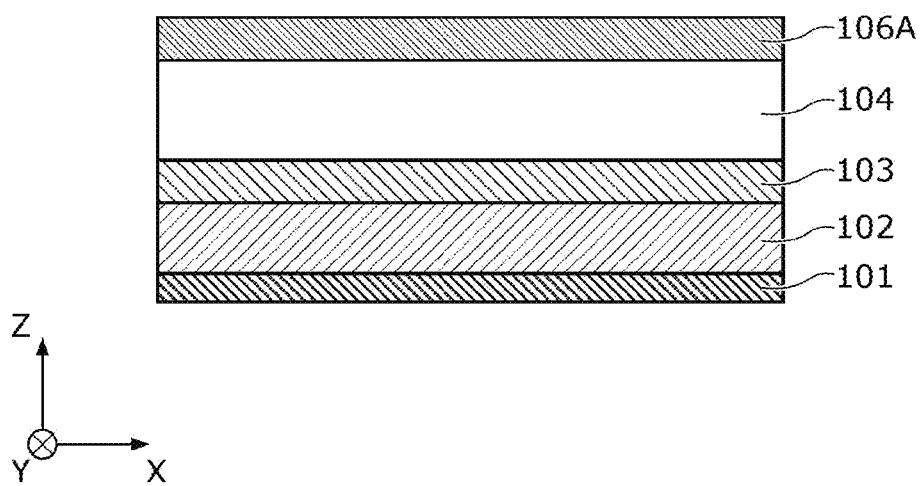
FIG. 13A is a cross-sectional view for explaining a process of a method for manufacturing a semiconductor device according to each of the embodiments and variations thereof.

First, as illustrated in FIG. 13A, on substrate 101 consisting of Si, buffer layer 102 having a thickness of 2 μm and consisting of a stacked structure of AlN and AlGaN, back-barrier layer 103 having a thickness of 1000 nm and consisting of $Al_{0.05}Ga_{0.95}N$ having an Al composition ratio of 5%, channel layer 104 having a thickness of 100 nm and consisting of GaN, and nitride semiconductor layer 106A consisting of InAlGaN are subjected to epitaxial growth sequentially and continuously in the +c plane direction (<0001> direction) in a semiconductor crystal growth device by using a metal organic chemical vapor deposition (MOCVD) method.

A condition in which growth temperature is, for example, between 600° C. and 1200° C. is applied as the growth condition of buffer layer 102. It should be noted that a reduced pressure condition is applied for growth pressure and that is, for example, less than or equal to 50 kPa.

A condition in which growth temperature is, for example, between 900° C. and 1200° C. is applied as the growth condition of back-barrier layer 103. Alternatively, the growth temperature may be within a range between 1000° C. and 1150° C. Back-barrier layer 103 with better film quality can be formed. Moreover, a reduced pressure condition is applied for growth pressure and that is, for example, less than or equal to 80 kPa. It should be noted that carbon (C), iron (Fe), or the like can be added as an impurity to back-barrier layer 103.

A condition in which growth temperature is, for example, between 900° C. and 1200° C. is applied as the growth condition of channel layer 104. Alternatively, the growth temperature may be within a range between 1000° C. and 1150° C. Channel layer 104 with better film quality can be formed. Moreover, either an atmospheric pressure condition or a reduced pressure condition may be applied for growth pressure. Moreover, excessive reduction in drain current, that is, current collapse due to an impurity can be suppressed by using GaN for channel layer 104 without intentionally adding an impurity.

A condition in which growth temperature is, for example, between 500° C. and 900° C. is applied as the growth condition of nitride semiconductor layer 106A. Alternatively, the growth temperature may be within a range between 550° C. and 750° C. Nitride semiconductor layer 106A with better film quality can be formed. Moreover, either an atmospheric pressure condition or a reduced pressure condition may be applied for growth pressure.

It should be noted that in the growth condition of nitride semiconductor layer 106A, the gas flow rate ratio of carrier gas consisting of mixed gas of $H_2$ and $N_2$ satisfies, for example, Expression (1) below. Therefore, etching of nitride semiconductor layer 106A can be suppressed.

$$N_2 \text{ gas flow rate}/(H_2 \text{ gas flow rate}+N_2 \text{ gas flow rate}) \geq 0.5 \quad \text{Expression (1)}$$

Moreover, the gas flow rate ratio of the carrier gas consisting of mixed gas of $H_2$ and $N_2$ may satisfy Expression (2) below. Therefore, the effect of suppressing etching can be further enhanced.

$$N_2 \text{ gas flow rate}/(H_2 \text{ gas flow rate}+N_2 \text{ gas flow rate})=1.0 \quad \text{Expression (2)}$$

Figure 13B:
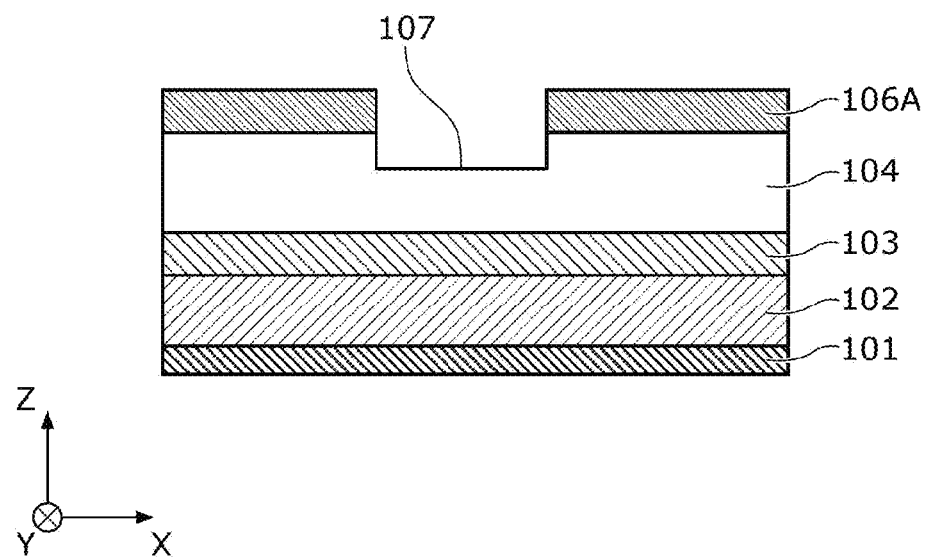
FIG. 13B is a cross-sectional view for explaining a process of the method for manufacturing the semiconductor device according to each of the embodiments and variations thereof.

Next, as illustrated in FIG. 13B, an area in which second barrier layer 106 is to be formed is coated with a resist, and then patterning is performed on the resist by using a lithography method. Next, the whole of nitride semiconductor layer 106A and 20 nm of channel layer 104 in the area in which second barrier layer 106 is to be formed are removed by using a dry etching method, and thereby first recessed portion 107 is formed. It should be noted that although a dry etching method is used in the present embodiment, first recessed portion 107 may be formed by using a wet etching method or by using a wet etching method after using a dry etching method.

It should be noted that the shape, position, and size of first recessed portion 107 can be adjusted according to the shape, position, and size of a portion removed by the patterning of the resist. First recessed portion 107 according to Embodiment 2 or 3 or variation thereof can be formed by adjusting the shape, position, and size of first recessed portion 107. For example, first recessed portion 107 having a step in its bottom face as illustrated in FIG. 9 can be formed by performing etching in two steps with different resist patterns. Moreover, first recessed portion 107 of which lateral face is sloped as illustrated in FIG. 10 can be formed by causing the shape of an end portion of the resist to be sloped.

As a specific example of dry etching, plasma treatment by an inductively coupled plasma (ICP) dry etching device is described in the present embodiment. It should be noted that plasma treatment by a capacitively coupled plasma (CCP) dry etching device or an electron cyclotron resonance (ECR) dry etching device may be used.

Etching by the ICP dry etching device is performed by, for example, using $BCl_3$ as a gas raw material and introducing $BCl_3$ gas at a gas flow rate of at least 10 sccm and not more than 30 sccm. At this time, HBr, $SiCl_4$, $Cl_2$, or $CCl_4$ may be added other than $BCl_3$ gas. Moreover, the gas in the IPC dry etching device may be diluted by introducing argon (Ar) or helium (He) that is an inert gas. A setting condition for the etching is, for example, a condition in which the pressure of etching atmosphere is at least 0.5 Pa and not more than 3 Pa, power applied to an upper electrode by 13.56 MHZ power source is at least 50 W and not more than 200 W, power applied to a lower electrode by 13.56 MHz power source is at least 5 W and not more than 20 W, and substrate temperature is at least 0° C. and not more than 20° C.

As a specific example of wet etching, etching by Ammonium-Hydrogen Peroxide Mixture (APM) is described. It should be noted that etching by tetramethyl ammonium hydroxide (TMAH), potassium hydroxide (KOH), or the like may be performed.

A setting for the etching by APM is, for example, a setting in which the following ratio is satisfied: $HN_4OH:H_2O_2:H_2O=1:1:5$, and the temperature of a chemical liquid is 70° C. Here, the pH value of the chemical liquid that is alkaline may be at least 10 and not more than 14, and the temperature of the chemical liquid may be at least 65° C. Thus, a defect generated by dry etching can be removed.

At this time, the surface of nitride semiconductor layer 106A may be covered with a hard mask and removed after wet etching. Thus, in channel layer 104, increase of crystal defects by the chemical liquid that is alkaline and has penetrated nitride semiconductor layer 106A can be suppressed.

Figure 13C:
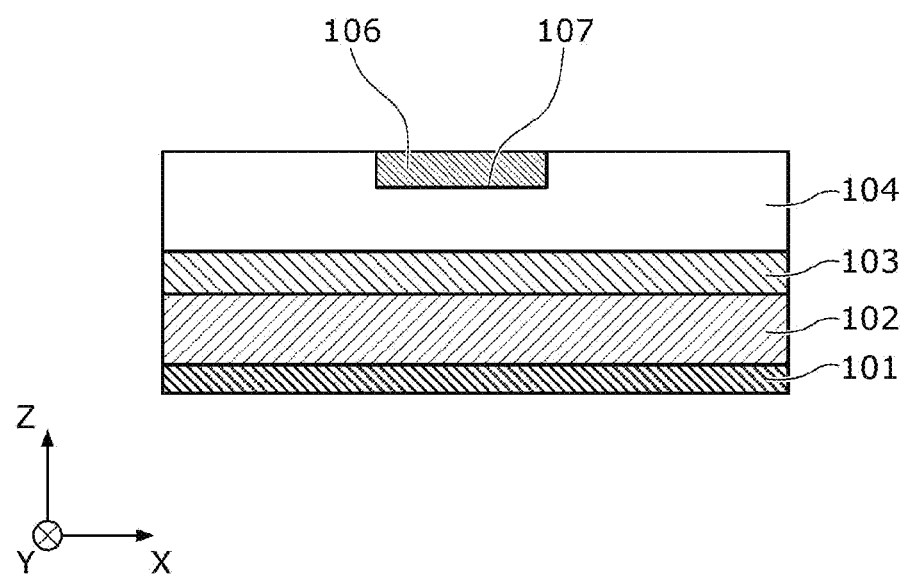
FIG. 13C is a cross-sectional view for explaining a process of the method for manufacturing the semiconductor device according to each of the embodiments and variations thereof.

Next, as illustrated in FIG. 13C, second barrier layer 106 is formed from nitride semiconductor layer 106A by a mass transport method so as to fill first recessed portion 107. For example, second barrier layer 106 is $In_{0.04}Al_{0.23}Ga_{0.73}N$ having a thickness of 20 nm, an In composition ratio of 4%, and an Al composition ratio of 23%.

Hereinafter, a method for forming second barrier layer 106 by the mass transport method is described in detail. After substrate 101 on which etching has been performed as above is put into a nitride semiconductor growth device, substrate 110 is heated in an atmosphere of a group-V raw material gas consisting of $NH_3$ and carrier gas consisting of mixed gas of $H_2$ and $N_2$. Moreover, in the heating, an organic metal that is a group-III raw material is not supplied to the nitride semiconductor growth device.

Next, through the heating in the atmosphere of $NH_3$ and the carrier gas consisting of mixed gas of $H_2$ and $N_2$, In atom, Al atom, and Ga atom that are group-III atoms and N atom that is a group-V atom are removed from the surface of nitride semiconductor layer 106A by etching effect of $NH_3$ and the carrier gas consisting of mixed gas of $H_2$ and $N_2$.

A mass transport phenomenon of the In atom, the Al atom, and the Ga atom that are group-III atoms removed from the surface of nitride semiconductor layer 106A occurs together with supply of the N atom that is a group-V atom decomposed from $NH_3$. In the atmosphere of $NH_3$ and the carrier gas consisting of mixed gas of $H_2$ and $N_2$, the In atom, the Al atom, the Ga atom, and the N atom are moved, by the mass transport phenomenon caused by the heating, to first recessed portion 107 having low potential energy, and thus first recessed portion 107 can be filled. Thus, second barrier layer 106 is formed and nitride semiconductor layer 106A formed above channel layer 104 disappears. Moreover, through the movement of each atom in a direction toward the hole and deposit of each atom inside the hole due to the mass transport phenomenon, the upper face of channel layer 104 and the surface of second barrier layer 106 become flush with each other without unevenness as illustrated in FIG. 13C.

It should be noted that second barrier layer 106 with a composition of $In_{0.04}Al_{0.23}Ga_{0.73}N$ can be achieved by appropriately controlling the composition of nitride semiconductor layer 106A; a condition including the temperature, pressure, carrier gas flow rate, and the like during the mass transport phenomenon; an elapsed time of the mass transport phenomenon; and the like.

Moreover, the gas flow rate ratio of the carrier gas when forming second barrier layer 106 by the mass transport phenomenon satisfies, for example, Expression (1) described above. Therefore, excessive etching due to $NH_3$ and the carrier gas consisting of mixed gas of $H_2$ and $N_2$ can be suppressed in a state where the surface of channel layer 104 and the surface of second barrier layer 106 are exposed as illustrated in FIG. 13C. Moreover, when the gas flow rate ratio satisfies Expression (2) described above, etching effect can be further suppressed.

Although second barrier layer 106 is formed by the mass transport method in the present embodiment, the present disclosure is not limited to this example. Second barrier layer 106 may be formed by a selective growth method after first recessed portion 107 is formed by forming a mask layer without forming nitride semiconductor layer 106A, and then the mask layer may be removed.

It should be noted that spacer layer 105a illustrated in FIG. 11 and FIG. 12 may be formed above channel layer 104 after second barrier layer 106 is formed. Moreover, spacer layer 105a may be formed before second barrier layer 106 is formed. Spacer layer 105a can be formed by a MOCVD method.

Figure 13D:
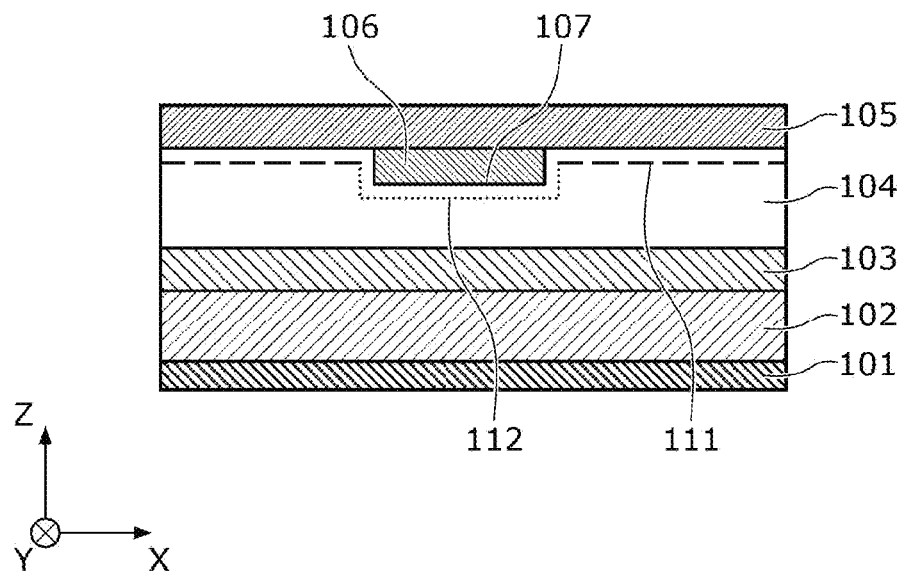
FIG. 13D is a cross-sectional view for explaining a process of the method for manufacturing the semiconductor device according to each of the embodiments and variations thereof.

Next, as illustrated in FIG. 13D, first barrier layer 105 is continuously formed on channel layer 104 and second barrier layer 106 in the semiconductor crystal growth device by the MOCVD method. For example, second barrier layer 106 is $Al_{0.27}Ga_{0.73}N$ having a thickness of 20 nm and an Al composition ratio of 27%.

Thus, since first barrier layer 105 and second barrier layer 106 are formed above channel layer 104, 2DEG is generated at an interface between channel layer 104 and each of first barrier layer 105 and second barrier layer 106 due to influence of spontaneous polarization and piezoelectric polarization caused by a lattice constant difference. In other words, first 2DEG 111 is generated at the interface between channel layer 104 and first barrier layer 105, and second 2DEG 112 is generated at the interface between channel layer 104 and second barrier layer 106.

Moreover, at this time, in semiconductor device 100 according to Example 1, first barrier layer 105 and second barrier layer 106 satisfy the following relationship regarding In composition ratio: 0≤first barrier layer 105<second barrier layer 106, and the following relationship regarding Al composition ratio:first barrier layer 105>second barrier layer 106. Moreover, since channel layer 104, first barrier layer 105, and second barrier layer 106 satisfy the following relationship regarding average lattice constant: channel layer 104>second barrier layer 106>first barrier layer 105, tensile stress to first barrier layer 105 and second barrier layer 106 can be reduced. Accordingly, since the amount of piezoelectric polarization below gate electrode 121 is reduced, the electron density of second 2DEG 112 can be lower than the electron density of first 2DEG 111.

A condition in which growth temperature is, for example, between 900° C. and 1200° C. is applied as the growth condition of first barrier layer 105. Alternatively, the growth temperature may be within a range between 1000° C. and 1150° C. Moreover, a reduced pressure condition is applied for growth pressure. For example, the growth pressure is less than or equal to 80 kPa. First barrier layer 105 with better film quality can be formed. It should be noted that the Al composition and film thickness of first barrier layer 105 and the condition for forming first barrier layer 105 can be, of course, changed as needed.

Figure 13E:
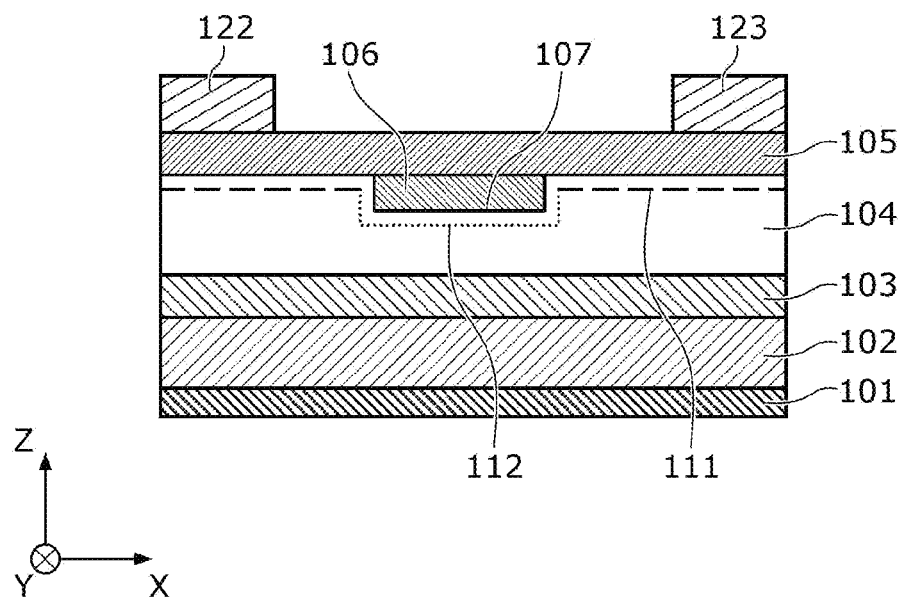
FIG. 13E is a cross-sectional view for explaining a process of the method for manufacturing the semiconductor device according to each of the embodiments and variations thereof.

Next, as illustrated in FIG. 13E, after pre-cleaning by hydrochloric acid is performed and Ti and Al are sequentially deposited by a sputtering method, patterning is performed on the stacked film of Ti and Al by sequentially applying a lithography method and a dry etching method, and thus source electrode 122 and drain electrode 123 in a predetermined shape are formed above first barrier layer 105. It should be noted that source electrode 122 and drain electrode 123 in the predetermined shape may be formed by sequentially applying a lithography method and a lift-off method. Next, by performing heat treatment in a nitrogen atmosphere, ohmic contact between first 2DEG 111 and each of source electrode 122 and drain electrode 123 is formed.

Next, after TiN and Al are sequentially deposited by a sputtering method, patterning is performed on the stacked film of TiN and Al by sequentially applying a lithography method and a dry etching method, and thus gate electrode 121 is formed above first barrier layer 105. It should be noted that gate electrode 121 in a predetermined shape may be formed by sequentially applying a lithography method and a lift-off method.

Through the above-described series of processes, semiconductor device 100 having a configuration illustrated in FIG. 1 is achieved.

It should be noted that second recessed portion 108A, second recessed portion 108B, or third recessed portion 109 may be formed before forming gate electrode 121. Second recessed portion 108A, second recessed portion 108B, or third recessed portion 109 is formed by sequentially performing application of a resist, patterning, etching, and removal of the resist, in the same manner as first recessed portion 107. Thus, semiconductor device 100A, 100B, or 400A illustrated in FIG. 4, FIG. 5, or FIG. 12 can be formed.

Other Embodiment

Although a semiconductor device according to one or more aspects has been described above based on embodiments, the present disclosure is not limited to these embodiments. For example, forms obtained by various modifications to the respective embodiments that can be conceived by a person skilled in the art as well as forms realized by arbitrarily combining constituent elements and functions in the embodiments which are within the essence of the present disclosure are included in the scope of the present disclosure.

Moreover, for each of the above-described embodiments, various changes, substitutions, additions, omissions, and so on, can be carried out within the scope of the Claims or its equivalents.

INDUSTRIAL APPLICABILITY

A semiconductor device according to the present disclosure is applicable to, for example, a communication device required to operate at high speed, an inverter, a power switching element used for power source circuit or the like.

The invention claimed is:

1. A semiconductor device comprising:
   a substrate;
   a back-barrier layer that is provided above the substrate and includes a group-III nitride semiconductor;
   a channel layer that is provided above the back-barrier layer, includes a gallium nitride semiconductor, and has a band gap smaller than a band gap of the back-barrier layer;
   a first barrier layer that is provided above the channel layer, includes a group-III nitride semiconductor containing Al, and has a band gap larger than the band gap of the channel layer;
   a second barrier layer that is provided to fill a first recessed portion provided in an upper face of the channel layer, includes a group-III nitride semiconductor containing Al, and has a band gap larger than the band gap of the channel layer;
   a two-dimensional electron gas that is generated on a channel layer side of an interface between the channel layer and the first barrier layer or the second barrier layer;
   a source electrode and a drain electrode that are provided above the first barrier layer, spaced apart from each other, and each electrically connected to the two-dimensional electron gas; and
   a gate electrode that is provided above the second barrier layer and spaced apart from the source electrode and the drain electrode, wherein:
   an In composition ratio of the first barrier layer is greater than or equal to 0 and less than an In composition ratio of the second barrier layer,
   the In composition ratio of the first barrier layer is represented by a ratio of a total number of In atoms to a total number of all of group-III elements included in the first barrier layer,
   the In composition ratio of the second barrier layer is represented by a ratio of a total number of In atoms to a total number of all of group-III elements included in the second barrier layer,
   an Al composition ratio of the first barrier layer is greater than or equal to an Al composition ratio of the second barrier layers,
   the Al composition ratio of the first barrier layer is represented by a ratio of a total number of Al atoms to the total number of all of the group-III elements included in the first barrier layer,
   the Al composition ratio of the second barrier layer is represented by a ratio of a total number of Al atoms to the total number of all of the group-III elements included in the second barrier layer, and
   the first barrier layer covers and is in direct contact with at least part of an upper face of the second barrier layer, which is opposite to a lower face of the second barrier layer facing the upper face of the channel layer.

2. The semiconductor device according to claim 1, wherein
   a second recessed portion is provided in an upper face of the first barrier layer below the gate electrode, and
   the gate electrode is in contact with a bottom face of the second recessed portion.

3. The semiconductor device according to claim 2, wherein
   the second recessed portion penetrates the first barrier layer, and
   the gate electrode is in contact with the second barrier layer.

4. The semiconductor device according to claim 1, wherein
   the second barrier layer protrudes, by a first length, from a drain electrode-side end of the gate electrode toward a drain electrode side.

5. The semiconductor device according to claim 4, wherein in the plan view, the second barrier layer protrudes, by a second length that is limited, from a source electrode-side end of the gate electrode toward a source electrode side, and the first length is longer than the second length.

6. The semiconductor device according to claim 1, wherein in a plan view of the substrate, the gate electrode protrudes from a source electrode-side end of the second barrier layer toward a source electrode side.

7. The semiconductor device according to claim 6, wherein in the plan view, the gate electrode protrudes from a drain electrode-side end of the second barrier layer toward a drain electrode side.

8. The semiconductor device according to claim 4, wherein in the plan view, a thickness of the second barrier layer is thicker at a position of the drain electrode-side end of the gate electrode than at a position of the source electrode-side end of the gate electrode.

9. The semiconductor device according to claim 4, wherein a source electrode-side lateral face or a drain electrode-side lateral face of the second barrier layer is sloped to cause a space between the source electrode-side lateral face or the drain electrode-side lateral face and a lower face of the first barrier layer to increase from an end portion toward a central portion of the second barrier layer, and an angle between the source electrode-side lateral face or the drain electrode-side lateral face and the lower face is an acute angle.

10. The semiconductor device according to claim 1, wherein the first barrier layer includes a plurality of layers including a spacer layer as a lowest layer, and the spacer layer has a band gap larger than a band gap of any one of the plurality of layers other than the spacer layer in the first barrier layer.

11. The semiconductor device according to claim 10, wherein a third recessed portion is provided in an upper face of the first barrier layer below the gate electrode, and extends to the spacer layer, and the gate electrode is in contact with a bottom face of the third recessed portion.

* * * * *